United States Patent
Sakaguchi et al.

(10) Patent No.: US 9,349,761 B2
(45) Date of Patent: May 24, 2016

(54) SOLID-STATE IMAGE PICKUP DEVICE AND COLOR SIGNAL READING METHOD INCLUDING A PLURALITY OF ELECTRICALLY-COUPLED SUBSTRATES

(71) Applicant: OLYMPUS CORPORATION, Tokyo (JP)

(72) Inventors: Naofumi Sakaguchi, Tokyo (JP); Shinichi Nakajima, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 554 days.

(21) Appl. No.: 13/707,181

(22) Filed: Dec. 6, 2012

(65) Prior Publication Data

US 2013/0161487 A1    Jun. 27, 2013

(30) Foreign Application Priority Data

Dec. 7, 2011   (JP) ................................. 2011-267898
Jun. 28, 2012  (JP) ................................. 2012-145582

(51) Int. Cl.
*G01J 3/50*    (2006.01)
*H01L 31/00*   (2006.01)
(Continued)

(52) U.S. Cl.
CPC .... *H01L 27/14601* (2013.01); *H01L 27/14645* (2013.01); *H04N 5/37452* (2013.01); *H04N 5/37457* (2013.01); *H04N 9/045* (2013.01); *H01L 27/14634* (2013.01)

(58) Field of Classification Search
CPC .................. H01L 27/14601; H01L 27/14634; H01L 27/14647; H01L 27/14645; H01L 27/14605; H01L 27/14603; H04N 5/37452; H04N 9/045; H04N 5/37457

USPC ........ 250/208.1, 226, 214.1, 214 R; 348/272, 348/273, 274, 278–280, 281, 282, 294, 302, 348/311, 300, 301; 257/443, 444, 440, 431, 257/459, 257, 258, 686

See application file for complete search history.

(56) References Cited

U.S. PATENT DOCUMENTS 4,500,915 A * 2/1985 Koike et al. ................... 348/283
4,910,588 A * 3/1990 Kinoshita et al. ............. 348/314
(Continued)

FOREIGN PATENT DOCUMENTS

JP   2001-024948 A    1/2001
JP   2002-344809 A   11/2002
(Continued)

OTHER PUBLICATIONS

US Office Action dated Sep. 30, 2014, issued in corresponding U.S. Appl. No. 13/693,119 (11 pages).
(Continued)

*Primary Examiner* — Que T Le
*Assistant Examiner* — Jennifer Bennett
(74) *Attorney, Agent, or Firm* — Westerman, Hattori, Daniels & Adrian, LLP

(57) ABSTRACT

A solid-state image pickup device according to one embodiment of the present invention includes: a first substrate including first pixels arranged in a matrix; and a second substrate electrically coupled to the first substrate and including second pixels arranged in a matrix. The first pixel including a photoelectric conversion element configured to generate a color signal corresponding to an m-th color is the first pixel corresponding to the m-th color where m is an integer equal to one of 1 to n. The second pixel including the signal storing circuit configured to store the color signal corresponding to the m-th color is the second pixel corresponding to the m-th color. At least two second pixels of the second pixels corresponding to the same color are arranged in the same column on the second substrate.

13 Claims, 16 Drawing Sheets

(51) Int. Cl.
*H01L 27/146* (2006.01)
*H04N 5/3745* (2011.01)
*H04N 9/04* (2006.01)

(56) References Cited

U.S. PATENT DOCUMENTS

| | | | |
|---|---|---|---|
| 6,518,910 | B2 | 2/2003 | Sakuragi et al. |
| 7,982,789 | B2 * | 7/2011 | Watanabe et al. ............. 348/308 |
| 8,508,639 | B2 * | 8/2013 | Mabuchi et al. ............. 348/308 |
| 8,896,736 | B2 * | 11/2014 | Kobayashi ......... H04N 5/23241 348/302 |
| 9,055,241 | B2 * | 6/2015 | Nakajima ............. H04N 5/335 |
| 2003/0010896 | A1 | 1/2003 | Kaifu et al. |
| 2005/0253945 | A1 | 11/2005 | Shinohara |
| 2011/0019053 | A1 | 1/2011 | Nishihara |
| 2013/0161487 | A1 | 6/2013 | Sakaguchi et al. |
| 2013/0161497 | A1 | 6/2013 | Sasada et al. |
| 2014/0016006 | A1 | 1/2014 | Tashiro et al. |
| 2014/0176770 | A1 | 6/2014 | Kondo |

FOREIGN PATENT DOCUMENTS

| | | |
|---|---|---|
| JP | 2003-259227 A | 9/2003 |
| JP | 2004-180045 A | 6/2004 |
| JP | 2006-049361 A | 2/2006 |
| JP | 2007-228460 A | 9/2007 |
| JP | 2008-277511 A | 11/2008 |
| JP | 2010-219339 A | 9/2010 |
| JP | 2011-091400 A | 5/2011 |
| JP | 2011-211455 A | 10/2011 |
| WO | 2006/129762 A1 | 12/2006 |

OTHER PUBLICATIONS

Japanese Office Action dated May 7, 2015, issued in corresponding JP Patent Application No. 2011-150081 with English translation (10 pages).

Japanese Office Action dated Aug. 18, 2015, issued in corresponding JP Patent Application No. 2011-267898 with English translation (6 pages).

* cited by examiner

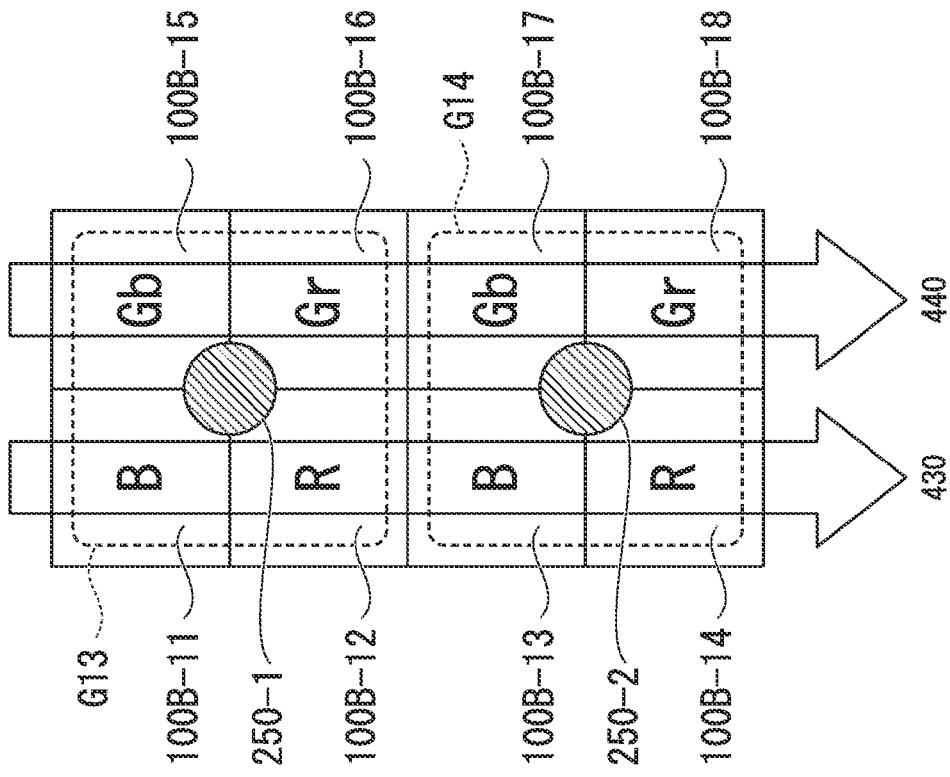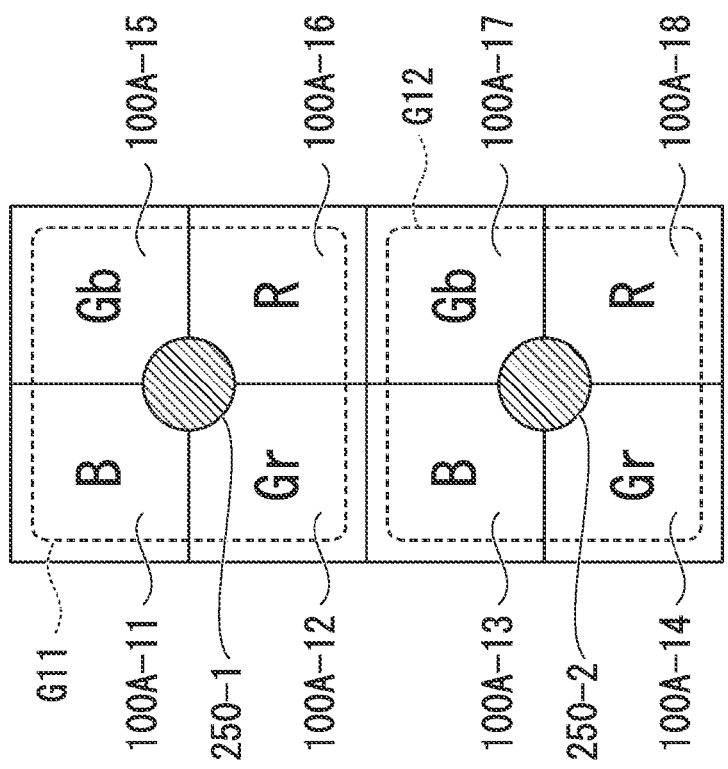

SOLID-STATE IMAGE PICKUP DEVICE AND COLOR SIGNAL READING METHOD INCLUDING A PLURALITY OF ELECTRICALLY-COUPLED SUBSTRATES

BACKGROUND OF THE INVENTION

1. Field of the Invention

The present invention relates to a solid-state image pickup device and an image pickup device, which include a plurality of electrically-coupled substrates on which circuit elements constituting pixels are placed. Additionally, the present invention relates to a signal reading method of reading signals from pixels.

Priority is claimed on Japanese Patent Application No. 2011-267898 filed Dec. 7, 2011, and Japanese Patent Application No. 2012-145582 filed Jun. 28, 2012, the contents of which are incorporated herein by reference.

2. Description of the Related Art

Recently, demand for digital cameras as image input devices has been increasing with the rapid spread of personal computers. There are several factors determining the quality of digital cameras. One of the factors is the number of pixels of an image pickup element, which is an important factor determining the resolution of a picked-up image. For this reason, digital cameras having more than 12,000,000 pixels have been commercialized recently.

As image pickup elements, amplified solid-state image pickup devices as typified by MOS image sensors such as CMOS (complementary metal oxide semiconductor), and charge coupled solid-state image pickup devices as typified by CCD (charge coupled device), are known. Those solid-state image pickup devices are widely used in digital still cameras, digital video cameras, and the like. Recently, as solid-state image pickup devices mounted on mobile devices such as cellular phones or PDAs (personal digital assistants) with cameras, MOS solid-state image pickup devices with low power voltage have been widely used from the standpoint of power consumption or the like.

Regarding such MOS solid-state image pickup devices, various solid-state image pickup devices have conventionally been proposed, such as a solid-state image pickup device in which a semiconductor chip having a pixel region on which multiple pixels are arranged and a semiconductor chip on which a signal processing circuit is formed are electrically coupled to constitute one device. For example, Japanese Patent Laid-Open Publication No. 2006-49361 discloses a solid-state image pickup device including: a semiconductor chip on which micro pads are formed on a wiring layer side for each unit pixel cell or each cell including multiple pixels; and a signal processing chip on which micro pads are formed on a wiring layer side at positions corresponding to those of the micro pads on the semiconductor chip, the signal processing chip being coupled to the semiconductor chip through micro bumps.

Additionally, Japanese Patent Laid-Open Publication No. 2010-219339 discloses a method of preventing an increase in chip area by a solid-state image pickup device in which a first substrate on which a photoelectric converter is formed is placed over a second substrate on which multiple MOS transistors are formed.

FIG. 15 illustrates a configuration of a solid-state image pickup device of the related art. The solid-state image pickup device of the related art includes: a first substrate 201 including a MOS image sensor; and a second substrate 202 including a signal processing circuit, the first substrate 201 being placed over the second substrate 202. A light enters a surface of the first substrate 201 which opposes another surface thereof to be coupled to the second substrate 202. In other words, the first substrate 201 is configured to have a surface on which a wiring layer is formed, and another surface which opposes that surface with the wiring layer formed and which receives a light.

Multiple micro pads 203 are formed on the wiring layer of the first substrate 201, for each cell including unit pixels or for each cell including multiple pixels, as will be explained later. Additionally, multiple micro pads 204 corresponding to the micro pads 203 on the first substrate 201 are formed on a surface of the second substrate 202 on a wiring layer side. The first substrate 201 is placed over the second substrate 202 such that the micro pads 203 face the corresponding micro pads 204. The micro pads 203 and the micro pads 204 are electrically coupled via micro bumps 205 and are thus integrated with one another. The micro pads 203 and 204 are formed smaller than normal pads.

The second substrate 202 is formed larger in area than the first substrate 201. Normal pads 206 are arranged on a surface of the second substrate 202, and are positioned outside the first substrate 201 in plan view. The pads 206 constitute an interface with a system other than the system including the two substrates.

FIG. 16 illustrates a configuration of the first substrate 201. The first substrate 201 includes: a pixel unit 208 including multiple pixel cells 207 two-dimensionally arranged; and a control circuit 209 that controls the pixel cells 207.

FIG. 17 illustrates a circuit configuration of the pixel cell 207 on the first substrate 201. Here, one pixel cell includes four pixels. The pixel cell 207 includes four photoelectric conversion elements 221A, 221B, 221C, and 221D. The photoelectric conversion elements 221A, 221B, 221C, and 221D are coupled respectively to sources of four transfer transistors 222A, 222B, 222C, and 222D. Gates of the transfer transistors 222A, 222B, 222C, and 222D are coupled respectively to transfer wires 227A, 227B, 227C, and 227D supplied with transfer pulses. Drains of the transfer transistors 222A, 222B, 222C, and 222D are coupled commonly to a source of a reset transistor 223. A charge retention unit FD called floating diffusion is coupled to a gate of an amplifier transistor 224. The charge retention unit FD is positioned between the source of the reset transistor 223 and a drain of each of the transfer transistors 222A, 222B, 222C, and 222D.

A drain of the reset transistor 223 is coupled to a power wire 232. A gate of the reset transistor 223 is coupled to a reset wire 228 supplied with a reset pulse. A drain of an activating transistor 225 is coupled to the power wire 232. A source of the activating transistor 225 is coupled to a drain of the amplifier transistor 224. A gate of the activating transistor 225 is coupled to an activation wire 229 supplied with an activation pulse. A source of the amplifier transistor 224 is coupled to a drain of an injection transistor 230. A source of the injection transistor 230 is coupled to a ground potential. A gate of the injection transistor 230 is coupled to an injection wire 231 supplied with an injection pulse. The midpoint connecting the amplifier transistor 224 and the injection transistor 230 is coupled to an output terminal 226.

The photoelectric conversion elements 221A, 221B, 221C, and 221D are, for example, photodiodes. The photoelectric conversion elements 221A, 221B, 221C, and 221D generate signal charge based on the incident light and store the generated signal charge. The transfer transistors 222A, 222B, 222C, and 222D are transistors that transfer the signal charge stored in the photoelectric conversion elements 221A, 221B, 221C, and 221D to the charge retention unit FD. The transfer transistors 222A, 222B, 222C, and 222D are on/off controlled by transfer pulses supplied from the control circuit 209 via the transfer wires 227A, 227B, 227C, and 227D. The charge retention unit FD constitutes an input unit of the amplifier transistor 224. The charge retention unit FD is a floating diffusion capacitor that temporarily stores the signal charge transferred from the photoelectric conversion elements 221A, 221B, 221C, and 221D.

The reset transistor 223 is a transistor that resets the charge retention unit FD. The reset transistor 223 is on/off controlled by the reset pulse supplied from the control circuit 209 via the reset wire 228. It is also possible to simultaneously turn on the reset transistor 223 and the transfer transistors 222A, 222B, 222C, and 222D, thereby resetting the photoelectric conversion elements 221A, 221B, 221C, and 221D.

The amplifier transistor 224 is a transistor that amplifies a signal based on the signal charge stored in the charge retention unit FD and outputs the amplified signal from the source thereof. The activating transistor 225 and the injection transistor 230 are transistors that supply to the amplifier transistor 224, a current that drives the amplifier transistor 224. The activating transistor 225 is on/off controlled by an activation pulse supplied from the control circuit 209 via the activation wire 229. The injection transistor 230 is on/off controlled by an injection pulse supplied from the control circuit 209 via an injection wire 231.

The photoelectric conversion elements 221A, 221B, 221C, and 221D; the transfer transistors 222A, 222B, 222C, and 222D; the reset transistor 223; the amplifier transistor 224; the activating transistor 225; and the injection transistor 230 constitute the one pixel cell 207 including four pixels.

Hereinafter, operation of the pixel cell 207 is explained with reference to FIG. 18. Firstly, an injection pulse Pn1 is applied to the injection transistor 230 via the injection wire 231, thereby turning on the injection transistor 230. Thus, the voltage of the output terminal 226 is fixed to 0V. Then, a reset pulse Pr is applied to the reset transistor 223 via the reset wire 228, thereby turning on the reset transistor 223. Thus, the voltage of the charge retention unit FD is reset to a high level (power voltage). When the voltage of the charge retention unit FD becomes high level, the amplifier transistor 224 turns on. Then, the application of the injection pulse Pn1 is released, thereby turning off the injection transistor 230. Then, an activation pulse Pk1 is applied to the activating transistor 225 via the activation wire 229, thereby turning on the activating transistor 225. As a result of the activating transistor 225 turning on, the voltage of the output terminal 226 increases up to the voltage corresponding to the voltage of the charge retention unit FD. The voltage of the output terminal 226 at that time is referred to as the reset level.

Then, the application of the activation pulse Pk1 is released, thereby turning off the activating transistor 225. Then, a transfer pulse Pt1 is applied to the transfer transistor 222A via the transfer wire 227A, thereby turning on the transfer transistor 222A. Thus, the signal charge of the corresponding photoelectric conversion element 221A is transferred to the charge retention unit FD. Then, an injection pulse Pn2 is applied to the injection transistor 230 via the injection wire 231, thereby turning on the injection transistor 230. Thus, the voltage of the output terminal 226 becomes 0V. Then, an activation pulse Pk2 is applied to the activating transistor 225 via the activation wire 229, thereby turning on the activating transistor 225. Thus, the voltage of the output terminal 226 increases up to the voltage corresponding to the voltage of the charge retention unit FD. The voltage of the output terminal 226 at that time is referred to as the signal level.

The signal based on the voltage of the output terminal 226 is input to the second substrate 202 via the micro bumps 205. The difference between the signal level and the reset level is detected in the second substrate 202, and an analog signal based on that difference is converted into a digital signal. Then, the digital signal is subjected to demultiplexing and then is stored in a memory. Thus, those digital signals are sequentially output from the solid-state image pickup device. Here, the explanation has been made with respect to the case where a signal is read from the photoelectric conversion element 221A which is one of the four photoelectric conversion elements 221A, 221B, 221C, and 221D. A similar operation is sequentially performed with respect to the other three photoelectric conversion elements 221B, 221C, and 221D.

By the above operation, exposing timings of the photoelectric conversion elements 221A, 221B, 221C, and 221D, which slightly differ thereamong, are substantially synchronized in a display, thereby achieving synchronization of the upper and lower portions of the pixel unit 208. Therefore, it is possible to increase the image processing speed without causing degradation of image quality at the time of reading signals.

In the aforementioned related art, although the exposing timings of the photoelectric conversion elements 221A, 221B, 221C, and 221D slightly differ thereamong, the exposing timings are substantially synchronized in the display, thereby achieving synchronization of the upper and lower portions of the pixel unit 208. To achieve the synchronization of the exposure, the solid-state image pickup device of the aforementioned related art includes: an AD conversion circuit that converts the analog signal output from the pixel to the digital signal; and the memory that stores the digital signals identical in number to photoelectric conversion elements.

It is assumed that operation by a mode that displays live view images on a viewfinder and operation by a mode that records motion images for HDTV require at least 60 frames per second, and 120 frames per second in some cases. Along with the high pixelation of digital cameras in recent years, many reading circuits have to operate in parallel in order to read signals from all the pixels at high frame rate, thereby causing an increase in chip area and power consumption, therefore making the implementation very difficult.

On the other hand, the live view image display and the HDTV motion picture mode do not require a large number of pixels, such as 12,000,000 or 16,000,000. For this reason, a mode that subsamples the pixels at the time of reading the signals can be considered. However, the subsampling causes moire fringes, and thereby resulting in deterioration of image quality.

Further, there is a solid-state image pickup device that reads out pixel signals from multiple channels. For example, FIG. 11 of Japanese Patent Laid-Open Publication No. 2003-259227 illustrates a solid-state image pickup device that reads out pixel signals from two channels. The solid-state image pickup device includes a channel for reading pixel signals from pixels in odd-numbered columns and a channel for reading signals from pixels in even-numbered columns.

In a case where pixel signals are read using two channels in a solid-state image pickup device having Bayer arrangement defined by four pixels corresponding to colors of red (R), green (Gr, Gb), and blue (B), a pixel signal corresponding to R and a pixel signal corresponding to B are read using the same channel. However, a pixel signal corresponding to Gr and a pixel signal corresponding to Gb are read using different channels. For this reason, a variation in properties of amplifiers provided for the respective channels or the like causes a variation to occur between the pixel signal corresponding to Gr and the pixel signal corresponding to Gb though Gr and Gb are the same color. For example, in a case where a gain of an amplifier provided for the channel for reading the pixel signal corresponding to Gr differs from a gain of the amplifier provided for the channel for reading the pixel signal corresponding to Gb, due to the above variation in the properties of the amplifiers, the pixel signal corresponding to Gr and the pixel signal corresponding to Gb, which are supposed to be amplified at the same gain, are amplified at different gains. Thereby, longitudinal stripes are included in an image formed by the pixel signals read.

SUMMARY

A solid-state image pickup device according to one embodiment of the present invention includes, but is not limited to: a first substrate including a plurality of first pixels arranged in a matrix, each of the first pixels including a photoelectric conversion element configured to generate a color signal corresponding to one of first to n-th colors where n is an integer equal to or greater than two; and a second substrate electrically coupled to the first substrate, the second substrate including a plurality of second pixels arranged in a matrix, and each of the second pixels including: a signal storing circuit configured to store the color signal generated by the photoelectric conversion element; and an output circuit configured to output from the second pixel to an external unit, the color signal stored in the signal storing circuit. The first pixel including the photoelectric conversion element configured to generate the color signal corresponding to an m-th color is the first pixel corresponding to the m-th color where m is an integer equal to one of 1 to n. The second pixel including the signal storing circuit configured to store the color signal corresponding to the m-th color is the second pixel corresponding to the m-th color. At least two second pixels of the second pixels corresponding to the same color are arranged in the same column on the second substrate.

A solid-state image pickup device according to another embodiment of the present invention includes, but is not limited to: a first substrate including a plurality of first pixels arranged in a matrix, each of the first pixels including a photoelectric conversion element configured to generate a color signal corresponding to one of first to n-th colors where n is an integer equal to or greater than two; and a second substrate electrically coupled to the first substrate, the second substrate including a plurality of second pixels arranged in a matrix, and each of the second pixels including: a signal storing circuit configured to store the color signal generated by the photoelectric conversion element; and an output circuit configured to output from the second pixel to an external unit, the color signal stored in the signal storing circuit. The first pixel including the photoelectric conversion element configured to generate the color signal corresponding to an m-th color is the first pixel corresponding to the m-th color where m is an integer equal to one of 1 to n. The second pixel including the signal storing circuit configured to store the color signal corresponding to the m-th color is the second pixel corresponding to the m-th color. An arrangement of colors corresponding to the first pixels differs from an arrangement of colors corresponding to the second pixels.

A solid-state image pickup device according to another embodiment of the present invention includes, but is not limited to: a first substrate including a plurality of first pixels arranged in a matrix, each of the first pixels including a photoelectric conversion element configured to generate a color signal corresponding to one of first to n-th colors where n is an integer equal to or greater than two; and a second substrate electrically coupled to the first substrate, the second substrate including: a plurality of second pixels arranged in a matrix; and a vertical signal line provided for each column, and each of the second pixels including: a signal storing circuit coupled to the vertical signal line, the signal storing circuit being configured to store the color signal generated by the photoelectric conversion element; and an output circuit configured to output from the second pixel to an external unit, the color signal stored in the signal storing circuit. The first pixel including the photoelectric conversion element configured to generate the color signal corresponding to an m-th color is the first pixel corresponding to the m-th color where m is an integer equal to one of 1 to n. The color signal generated by the photoelectric conversion element included in one of the first pixels corresponding to the same color is stored in a corresponding one of the signal storing circuits coupled to the same vertical signal line.

An image pickup device according to another embodiment of the present invention includes, but is not limited to: a first substrate including a plurality of first pixels arranged in a matrix, each of the first pixels including a photoelectric conversion element configured to generate a color signal corresponding to one of first to n-th colors where n is an integer equal to or greater than two; and a second substrate electrically coupled to the first substrate, the second substrate including a plurality of second pixels arranged in a matrix, and each of the second pixels including: a signal storing circuit configured to store the color signal generated by the photoelectric conversion element; and an output circuit configured to output from the second pixel to an external unit, the color signal stored in the signal storing circuit. The first pixel including the photoelectric conversion element configured to generate the color signal corresponding to an m-th color is the first pixel corresponding to the m-th color where m is an integer equal to one of 1 to n. The second pixel including the signal storing circuit configured to store the color signal corresponding to the m-th color is the second pixel corresponding to the m-th color. At least two second pixels of the second pixels corresponding to the same color are arranged in the same column on the second substrate.

An image pickup device according to another embodiment of the present invention includes, but is not limited to: a first substrate including a plurality of first pixels arranged in a matrix, each of the first pixels including a photoelectric conversion element configured to generate a color signal corresponding to one of first to n-th colors where n is an integer equal to or greater than two; and a second substrate electrically coupled to the first substrate, the second substrate including a plurality of second pixels arranged in a matrix, and each of second pixels including: a signal storing circuit configured to store the color signal generated by the photoelectric conversion element; and an output circuit configured to output from the second pixel to an external unit, the color signal stored in the signal storing circuit. The first pixel including the photoelectric conversion element configured to generate the color signal corresponding to an m-th color is the first pixel corresponding to the m-th color where m is an integer equal to one of 1 to n. The second pixel including the signal storing circuit configured to store the color signal corresponding to the m-th color is the second pixel corresponding to the m-th color. An arrangement of colors corresponding to the first pixels differs from an arrangement of colors corresponding to the second pixels.

An image pickup device according to another embodiment of the present invention includes, but is not limited to: a first substrate including a plurality of first pixels arranged in a matrix, each of the first pixels including a photoelectric conversion element configured to generate a color signal corresponding to one of first to n-th colors where n is an integer equal to or greater than two; and a second substrate electrically coupled to the first substrate, the second substrate including: a plurality of second pixels arranged in a matrix; and a vertical signal line provided for each column, and each of the second pixels including: a signal storing circuit coupled to the vertical signal line, the signal storing circuit being configured to store the color signal generated by the photoelectric conversion element; and an output circuit configured to output from the second pixel to an external unit, the color signal stored in the signal storing circuit. The first pixel including the photoelectric conversion element configured to generate the color signal corresponding to an m-th color is the first pixel corresponding to the m-th color where m is an integer equal to one of 1 to n. The color signal generated by the photoelectric conversion element included in one of the first pixels corresponding to the same color is stored in a corresponding one of the signal storing circuits coupled to the same vertical signal line.

A signal reading method according to another embodiment of the present invention includes, but is not limited to: generating a color signal corresponding to one of first to n-th colors in one of a plurality of first pixels included in a first substrate, where n is an integer equal to or greater than two; storing the color signal generated in a corresponding one of a plurality of second pixels arranged in the same column on a second substrate electrically coupled to the first substrate; and outputting the color stored from the second pixel to an external unit.

A solid-state image pickup device according to another embodiment of the present invention includes, but is not limited to: a first substrate including a plurality of first pixels arranged in a matrix, each of the first pixels including a photoelectric conversion element configured to generate a color signal corresponding to one of first to n-th colors where n is an integer equal to or greater than two; a second substrate electrically coupled to the first substrate, the second substrate including a plurality of second pixels arranged in a matrix, and each of the second pixels including a signal storing circuit configured to store the color signal generated by the photoelectric conversion element; an averaging circuit configured to average each of the color signals stored in the signal storing circuits included in at least two second pixels of the second pixels arranged in the same column; and an output circuit configured to output each of the color signals averaged from the second pixel to an external unit. The first pixel including the photoelectric conversion element configured to generate the color signal corresponding to an m-th color is the first pixel corresponding to the m-th color where m is an integer equal to one of 1 to n. The second pixel including the signal storing circuit configured to store the color signal corresponding to the m-th color is the second pixel corresponding to the m-th color. At least two second pixels of the second pixels corresponding to the same color are arranged in the same column on the second substrate.

BRIEF DESCRIPTION OF THE DRAWINGS

The above features and advantages of the present invention will be more apparent from the following description of certain preferred embodiments taken in conjunction with the accompanying drawings, in which:

FIGS. 9A and 9B are reference diagrams illustrating another example of group of pixels included in the solid-state image pickup device according to the first embodiment of the present invention;

DETAILED DESCRIPTION OF THE PREFERRED EMBODIMENTS

Hereinafter, embodiments of the present invention will be described with reference to drawings. Detailed explanations below include specific detailed contents as an example. Those skilled in the art will recognize that many alternative embodiments can be accomplished without departing from the scope of the present invention. Accordingly, the embodiments illustrated herein for explanatory purposes do not limit the generality of the claimed inventions, and the claimed inventions are not limited to the embodiments.

First Embodiment

Figure 1:
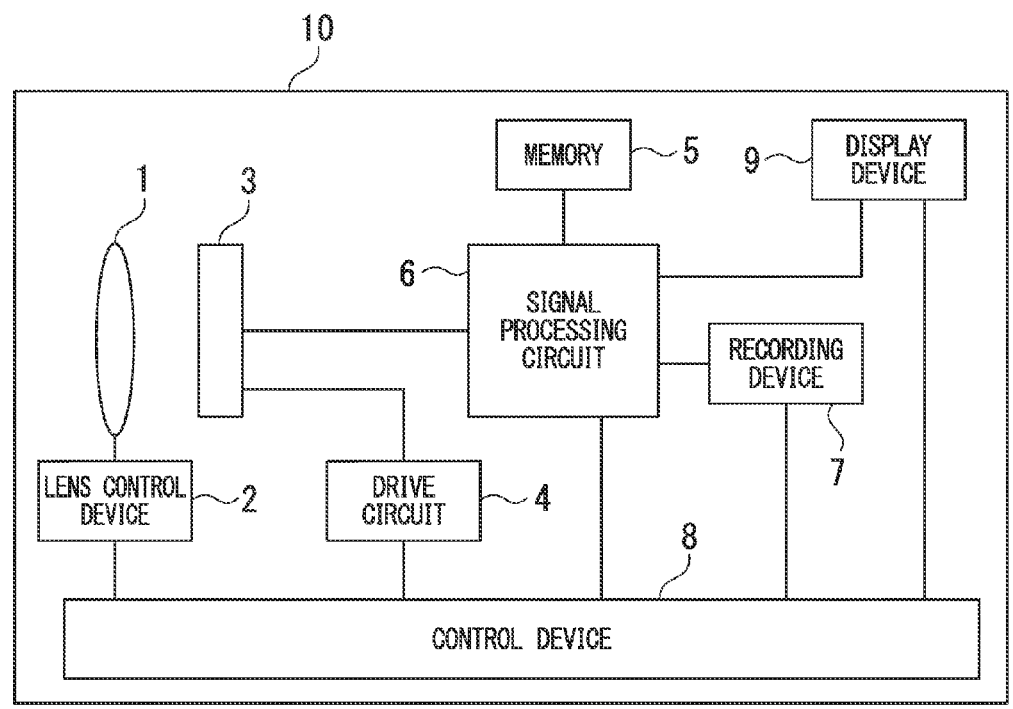
FIG. 1 is a block diagram illustrating a configuration of an image pickup device to which a solid-state image pickup device according to a first embodiment of the present invention is applied.

FIG. 1 illustrates a configuration of a digital camera as an example of an image pickup device to which a solid-state image pickup device according to a first embodiment of the present invention is applied. An image pickup device according to one embodiment of the present invention is not limited to a digital camera as long as the image pickup device is an electronic device having an image pickup function, such as a digital video camera, or an endoscope.

A digital camera 10 shown in FIG. 1 includes: a lens unit 1; a lens control device 2; a solid-state image pickup device 3; a drive circuit 4; a memory 5; a signal processing circuit 6; a recording device 7; a control device 8; and a display device 9.

Each block shown in FIG. 1 can be implemented by various hardware components including: electric circuit components such as a CPU and a memory of a computer; optical components such as lenses; and operation components such as buttons and switches. Further, each block shown in FIG. 1 can be implemented by software, such as computer programs. Here, each block shown in FIG. 1 is described as a functional block implemented as a combination of those hardware and software. Accordingly, those skilled in the art will recognize that various embodiments of those functional blocks can be implemented as combinations of hardware and software.

The lens unit 1 includes a zoom lens and a focus lens. The lens unit 1 reflects a light from an object onto a light receiving surface of the solid-state image pickup device 3 to form an object image. The lens control device 2 controls zoom, focus, aperture, and the like of the lens unit 1. The light receiving surface of the solid-state image pickup device 3 receives the light via the lens unit 1 to form an image. The solid-state image pickup device 3 converts the object image formed on the light receiving surface into an image signal, and outputs the image signal. Multiple pixels are two-dimensionally arranged in row and column directions on the light receiving surface of the solid-state image pickup device 3.

The drive circuit 4 drives the solid-state image pickup device 3 and controls operation of the solid-state image pickup device 3. The memory 5 temporarily stores image data. The signal processing circuit 6 performs a predetermined process on the image signal output from the solid-state image pickup device 3. The process performed by the signal processing circuit 6 includes amplification of image signals, various corrections of image data, compression of image data, and the like.

The recording device 7 includes a semiconductor memory or the like for recording and/or reading image data. The recording device 7 is detachably built in the digital camera 10. The display device 9 performs: displaying of motion images (live view images) or still images; displaying of motion images and still images recorded on the recording device 7; displaying of a state of the digital camera 10; and the like.

The control device 8 controls the entire digital camera 10. Operation of the control device 8 is defined by a program stored in a ROM built in the digital camera 10. The control device 8 reads the program and performs each control according to instructions defined by the program.

Figure 2:
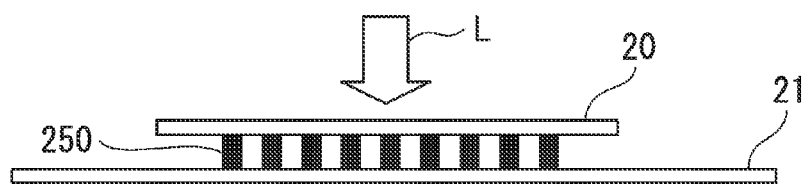
FIG. 2 is a cross-sectional view illustrating the solid-state image pickup device according to the first embodiment of the present invention.

FIG. 2 illustrates a cross-sectional configuration of the solid-state image pickup device 3. The solid-state image pickup device 3 has a structure such that one of two substrates (a first substrate 20, a second substrate 21), on which circuit elements (such as photoelectric conversion elements, transistors, and capacitors) constituting pixels are arranged, is placed over the other one of the substrates. The circuit elements constituting pixels are distributedly arranged on the first substrate 20 and the second substrate 21. The first substrate 20 and the second substrate 21 are electrically coupled to each other so that electric signals are communicable therebetween at the time of driving the pixels.

Photoelectric conversion elements are formed on one of two main surfaces of the first substrate 20 (surfaces having larger in surface area than side surfaces), which is on the side irradiated with a light L. The light irradiating the first substrate 20 enters the photoelectric conversion elements. Multiple couplers 250 are formed on the other main surface of the first substrate 20 opposing the main surface irradiated with the light L. The couplers 250 are used for coupling the first substrate 20 to the second substrate 21. Signals based on signal charge generated by the photoelectric conversion elements arranged on the first substrate 20 are output to the second substrate 21 via the couplers 250. In the case of FIG. 2, the main surface of the first substrate 20 and the main surface of the second substrate 21 have different areas, but may have the same area.

Figure 3:
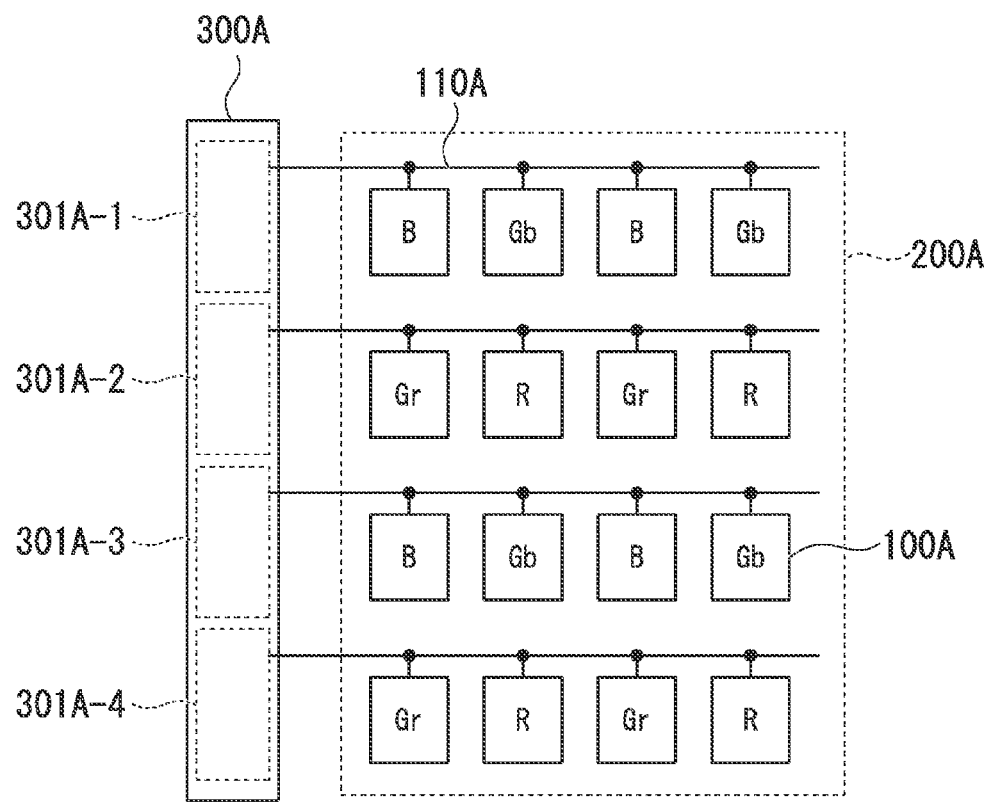
FIG. 3 is a block diagram illustrating a configuration of the solid-state image pickup device according to the first embodiment of the present invention.

FIG. 3 illustrates a configuration of the solid-state image pickup device 3 on the first substrate 20. As shown in FIG. 3, the solid-state image pickup device 3 includes a pixel unit 200A and a vertical scanning circuit 300A. The pixel unit 200A includes pixels 100A arranged in a two-dimensional matrix. In the case of FIG. 3, the pixels 100A are arranged in 4 rows and 4 columns. However, arrangement of pixels is not limited thereto as long as the number of rows is 2 or more and the number of columns is 2 or more. The arrangement of the pixels 100A is Bayer arrangement defined by four pixels corresponding to colors of read (R), green (Gr, Gb), and blue (B). The colors of the pixels 100A correspond to the colors of color filters arranged on the pixels 100A. For example, in a case where R color filters are arranged on the pixels 100A, the pixels 100A correspond to R. Photoelectric conversion elements in the pixels 100A (photoelectric conversion elements 201, 202, 203, and 204 that will be explained later) store signal charge corresponding to the colors of the color filters arranged on the pixels 100A.

The vertical scanning circuit 300A performs drive control of the pixel unit 200A in units of rows. In order to perform that drive control, the vertical scanning circuit 300A includes unit circuits 301A-1, 301A-2, 301A-3, and 301A-4 which are identical in number to the rows. Each of the unit circuits 301A-i (i=1, 2, 3, 4) outputs to a signal line 110A provided for each row, a control signal that controls the pixels 100A arranged in one row. The signal line 110A is coupled to the pixels 100A and supplies to the pixels 100A, the control signal output from the unit circuit 301A-i. In the case of FIG. 3, each signal line 110A corresponding to each row is expressed by one line. However, each signal line 110A includes multiple signal lines.

Figure 4:
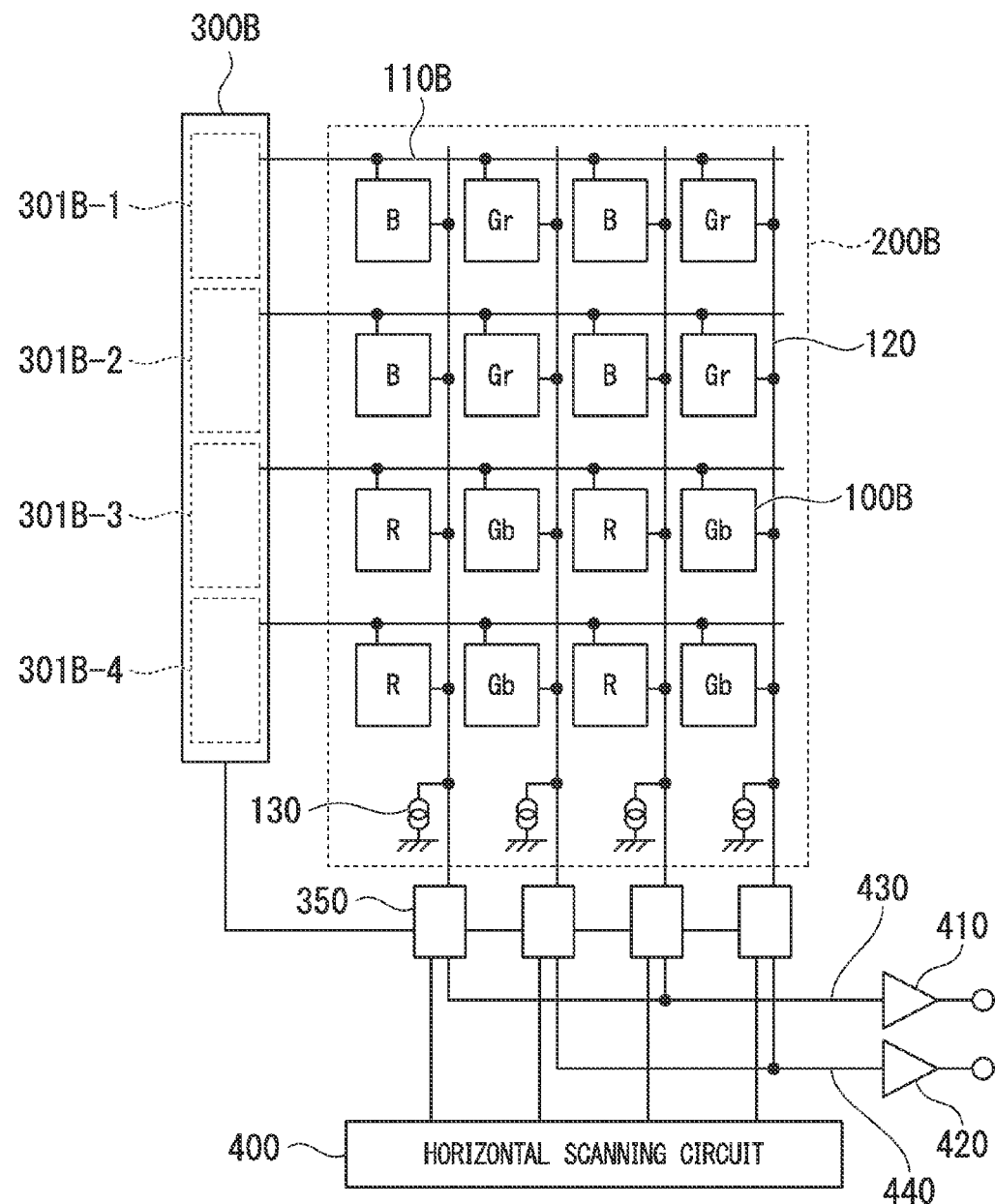
FIG. 4 is a block diagram illustrating a configuration of the solid-state image pickup device according to the first embodiment of the present invention.

FIG. 4 illustrates a configuration of the solid-state image pickup device 3 on the second substrate 21. As shown in FIG. 4, the solid-state image pickup device 3 includes: a pixel unit 200B; a vertical scanning circuit 300B; a column processing circuit 350; a horizontal scanning circuit 400; and output amplifiers 410 and 420.

The pixel unit 200B includes: pixels 100B arranged in a two-dimensional matrix; and a current source 130 provided for each column. In the case of FIG. 4, the pixels 100B are arranged in 4 rows and 4 columns. However, arrangement of pixels is not limited thereto as long as the number of rows is 2 or more and the number of columns is 2 or more. Arrangement of colors corresponding to the pixels 100B differs from the arrangement of colors corresponding to the pixels 100A.

Specifically, the pixels 100B corresponding to R and the pixels 100B corresponding to B are arranged in odd-numbered columns. The pixels 100B corresponding to Gr and the pixels 100B corresponding to Gb are arranged in even-numbered columns. In the pixel unit 200A, the pixels 100A corresponding to Gr and the pixels 100A corresponding to Gb are arranged in different columns. However, in the pixel unit 200B, the pixels 100B corresponding to Gr and the pixels 100B corresponding to Gb are arranged in the same column. Thereby, as the entire pixel unit 200B, the pixels 100B corresponding to the same color are arranged in the same column. The color of the pixel 100B corresponds to the color of the pixel 100A that generates the signal charge to be stored in the pixel 100B. For example, the pixel 100B, which stores the signal charge generated by the pixel 100A corresponding to R, corresponds to R.

The pixels 100B are coupled to a vertical signal line 120 provided for each column. The current power 130 is coupled to the vertical signal line 120. The current power 130 and amplifier transistors (second amplifier transistors 241, 242, 243, and 244 that will be explained later) in the pixel 100B constitute a source follower circuit.

The vertical scanning circuit 300B performs drive control of the pixel unit 200B in units of rows. In order to perform that drive control, the vertical scanning circuit 300B includes unit circuits 301B-1, 301B-2, 301B-3, and 301B-4 which are identical in number to the rows. Each of the unit circuits 301B-i (i=1, 2, 3, 4) outputs to a signal line 110B provided for each row, a control signal that controls the pixels 100B arranged in one row. The signal line 110B is coupled to the pixels 100B and supplies to the pixels 100B, the control signal output from the unit circuit 301B-i. In the case of FIG. 4, each signal line 110B corresponding to each row is expressed by one line. However, each signal line 110B includes multiple signal lines. Pixel signals of the pixels 100B arranged in the row selected by the control signal are output to the vertical signal line 120.

The column processing circuit 350 performs a signal process, such as noise reduction, on the pixel signals output to the vertical signal line 120. The column processing circuits 350 provided correspondingly to the odd-numbered columns are coupled to an output channel 430 (a horizontal signal line and an output signal line). The column processing circuits 350 provided correspondingly to the even-numbered columns are coupled to an output channel 440 (a horizontal signal line and an output signal line). An output amplifier 410 is coupled to the output channel 430. An output amplifier 420 is coupled to the output channel 440. The horizontal scanning circuit 400 outputs to the output amplifiers 410 and 420, the pixel signals of the pixels 100B arranged in one row, which are output to the vertical signal lines 120 and processed by the column processing circuits 350, in chronological order and in horizontal arrangement order. The output amplifiers 410 and 420 amplify the input pixel signals and output the amplified pixel signals as image signals from the solid-state image pickup device 3 to external units.

Thus, the output amplifier 410 receiving the pixel signals output from the pixels 100B in the odd-numbered columns and the output amplifier 420 receiving the pixel signals output from the pixels 100B in the even-numbered columns are provided. The pixel signals output from the pixels 100B corresponding to the same color are output to the same output amplifier.

Specifically, the pixel signal output from the pixel 100B corresponding to R and the pixel signal output from the pixel 100B corresponding to B are input to the output amplifier 410. The pixel signal output from the pixel 100B corresponding to Gr and the pixel signal output from the pixel 100B corresponding to Gb are input to the output amplifier 420. For this reason, it is possible to prevent a variation from occurring between pixel signals corresponding to the same color, which is caused by a variation in properties of the output amplifiers, and thereby prevent longitudinal stripes from being included in an image formed by the read pixel signals.

In the first embodiment, the column processing circuits 350, the horizontal scanning circuit 400, and the output amplifiers 410 and 420 are arranged on the second substrate 21, but may be arranged on the first substrate 20. Additionally, circuit elements constituting the column processing circuits 350, the horizontal scanning circuit 400, and the output amplifiers 410 and 420 may be distributedly arranged on the first substrate 20 and the second substrate 21.

In the first embodiment, a region including all the pixels of the solid-state image pickup device 3 is used as a region targeted for reading pixel signals. However, part of the region including all the pixels of the solid-state image pickup device 3 may be used as the reading target region. Preferably, the reading target region at least includes all pixels included in an effective pixel region. The reading target region may include optical black pixels (pixels where a light is always blocked) arranged outside the effective pixel region. For example, signals read from the optical black pixels are used to correct dark current elements.

Figure 5A:
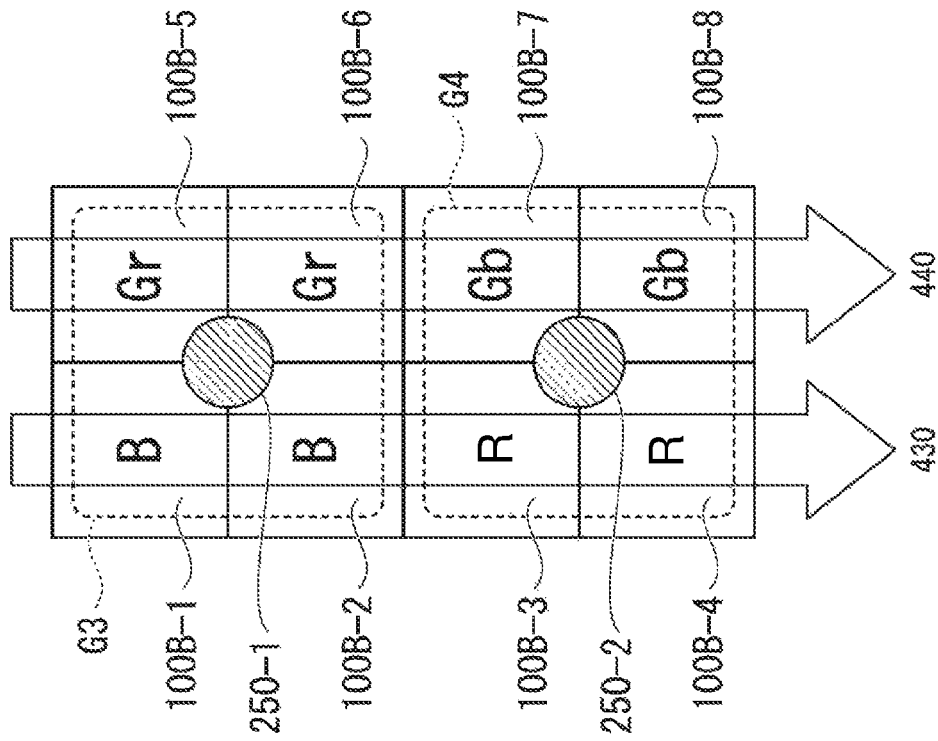
FIG. 5A-5B is a reference diagram illustrating an example of groups of pixels included in the solid-state image pickup device according to the first embodiment of the present invention.
Figure 5B:
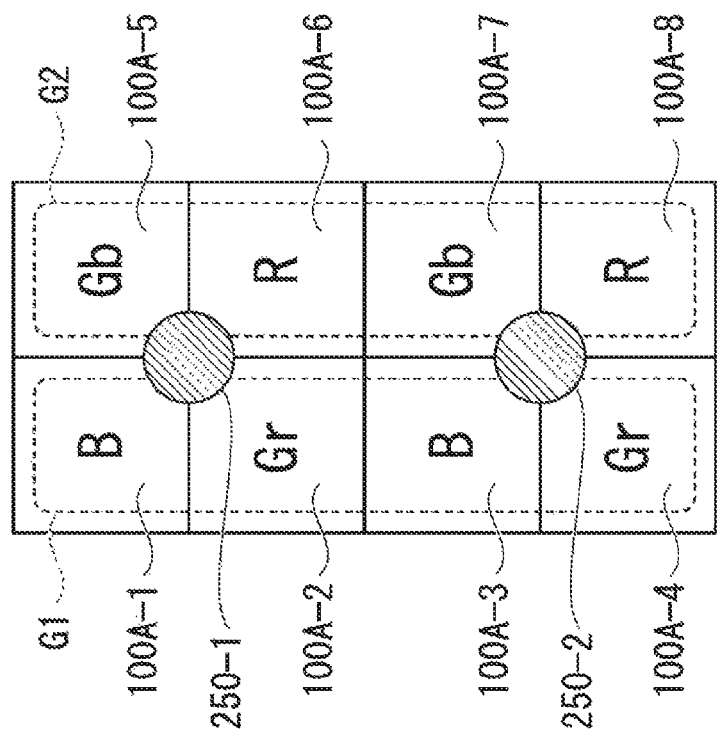

In the first embodiment, multiple pixels 100A share one coupler 250 and multiple pixels 100B share one coupler 250. Additionally, the multiple pixels 100A sharing the one coupler 250 are grouped into one group. The multiple pixels 100B sharing the one coupler 250 are grouped into one group. FIG. 5A illustrates groups of the pixels 100A and FIG. 5B illustrates groups of the pixels 100B. FIG. 5A shows arrangement of only a part of the pixels 100A included in the pixel unit 200A. FIG. 5B shows arrangement of only a part of the pixels 100B included in the pixel unit 200B. However, arrangement of the remaining pixels 100A and arrangement of the remaining pixels 100B are similar to those shown in FIGS. 5A and 5B.

As shown in FIG. 5A, on the first substrate 20, the four pixels 100A arranged in four rows and one column share one coupler 250. Specifically, the pixels 100A-1 and 100A-3 corresponding to B and the pixels 100A-2 and 100A-4 corresponding to Gr share the coupler 250-1. Those pixels 100A-1, 100A-2, 100A-3, and 100A-4 constitute a group G1. Additionally, the pixels 100A-5 and 100A-7 corresponding to Gb and the pixels 100A-6 and 100A-8 corresponding to R share the coupler 250-2. Those pixels 100A-5, 100A-6, 100A-7, and 100A-8 constitute a group G2.

As shown in FIG. 5B, on the second substrate 21, the four pixels 100B arranged in two rows and two columns share one coupler 250. Specifically, the pixels 100B-1 and 100B-2 corresponding to B and the pixels 100B-5 and 100B-6 corresponding to Gr share the coupler 250-1. Those pixels 100B-1, 100B-2, 100B-5, and 100B-6 constitute a group G3. Additionally, the pixels 100B-3 and 100B-4 corresponding to R and the pixels 100B-7 and 100B-8 corresponding to Gb share the coupler 250-2. Those pixels 100B-3, 100B-4, 100B-7, and 100B-8 constitute a group G4. As explained above, arrangements of the couplers 250 and groups are determined so that the total eight pixels in the two groups on the first substrate 20 respectively overlap the eight pixels in the two groups on the second substrate 21.

The pixels 100A in the group G1 respectively correspond to the pixels 100B in the group G3. In other words, signal charge generated by the pixel 100A in the group G1 is input to and stored in the corresponding pixel 100B in the group G3 via the coupler 250-1. Additionally, the pixels 100A in the group G2 respectively correspond to the pixels 100B in the group G4. In other words, signal charge generated by the pixel 100A in the group G2 is input to and stored in the corresponding pixel 100B in the group G4 via the coupler 250-2. The vertical scanning circuits 300A and 300B correspond the pixels 100A in the group G1 respectively to the pixels 100B in the group G3, and correspond the pixels 100A in the group G2 respectively to the pixels 100B in the group G4. The vertical scanning circuits 300A and 300B generate control signals that control the pixels 100A and 100B, and output the control signals to the pixels 100A and 100B via the signal lines 110A and 110B.

As shown in FIG. 5B, the pixels 100B-1 and 100B-2 corresponding to B and the pixels 100B-3 and 100B-4 corresponding to R are arranged in the same column. Pixel signals (B signals, R signals) output from those pixels are processed by the column processing circuit 350, and then are output to the output amplifier 410 via the output channel 430. Additionally, the pixels 100B-5 and 100B-6 corresponding to Gr and the pixels 100B-7 and 100B-8 corresponding to Gb are arranged in the same column. Pixel signals (G signals) output from those pixels are processed by the column processing circuit 350, and then are output to the output amplifier 420 via the output channel 440.

Figure 6:
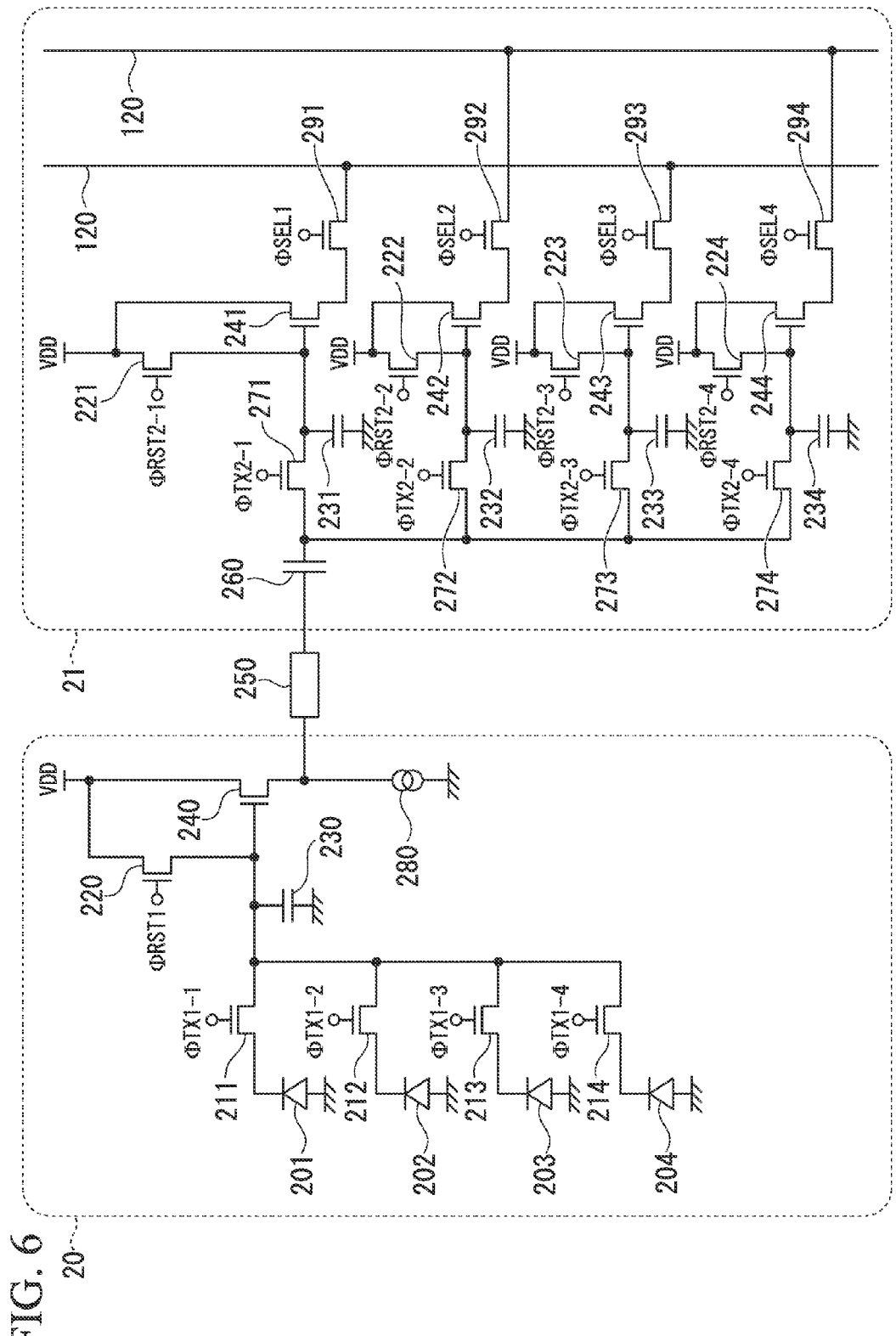
FIG. 6 is a circuit diagram illustrating a circuit configuration of pixels included in the solid-state image pickup device according to the first embodiment of the present invention.

Hereinafter, configurations of the pixels 100A and 100B are explained. FIG. 6 illustrates a circuit configuration of the four pixels 100A and the four pixels 100B, which share one coupler 250. The group including the four pixels 100A arranged on the first substrate 20 includes: photoelectric conversion elements 201, 202, 203, and 204; first transfer transistors 211, 212, 213, and 214; a charge retention unit 230 (floating diffusion); a first reset transistor 220; a first amplifier transistor 240; and a current power 280. The group including the four pixels 100B arranged on the second substrate 21 includes: a clamp capacitor 260; second transfer transistors 271, 272, 273, and 274; second reset transistors 221, 222, 223, and 224; analog memories 231, 232, 233, and 234; second amplifier transistors 241, 242, 243, and 244; and select transistors 291, 292, 293, and 294. The arrangement positions of the circuit elements shown in FIG. 6 do not always match the actual arrangement positions.

The relationship between each pixel 100A in the group G1 shown in FIG. 5A and each circuit element shown in FIG. 6 is as follows. The pixel 100A-1 includes: the photoelectric conversion element 201; the first transfer transistor 211; the charge retention unit 230; the first reset transistor 220; the first amplifier transistor 240; and the current power 280. The pixel 100A-2 includes: the photoelectric conversion element 202; the first transfer transistor 212; the charge retention unit 230; the first reset transistor 220; the first amplifier transistor 240; and the current power 280. The pixel 100A-3 includes: the photoelectric conversion element 203; the first transfer transistor 213; the charge retention unit 230; the first reset transistor 220; the first amplifier transistor 240; and the current power 280. The pixel 100A-4 includes: the photoelectric conversion element 204; the first transfer transistor 214; the charge retention unit 230; the first reset transistor 220; the first amplifier transistor 240; and the current power 280. The charge retention unit 230, the first reset transistor 220, the first amplifier transistor 240, and the current power 280 are shared by the four pixels 100A. The relationship between each pixel 100A in the group G2 and each circuit element shown in FIG. 6 is similar to the above.

The relationship between each pixel 100B in the group G3 shown in FIG. 5B and each circuit element shown in FIG. 6 is as follows. The pixel 100B-1 includes: the clamp capacitor 260; the second transfer transistor 271; the second reset transistor 221; the analog memory 231; the second amplifier transistor 241; and the select transistor 291. The pixel 100B-5 includes: the clamp capacitor 260; the second transfer transistor 272; the second reset transistor 222; the analog memory 232; the second amplifier transistor 242; and the select transistor 292. The pixel 100B-2 includes: the clamp capacitor 260; a second transfer transistor 273; the second reset transistor 223; the analog memory 233; the second amplifier transistor 243; and the select transistor 293. The pixel 100B-6 includes: the clamp capacitor 260; the second transfer transistor 274; the second reset transistor 224; the analog memory 234; the second amplifier transistor 244; and the select transistor 294. The clamp capacitor 260 is shared by the four pixels 100B. The relationship between each pixel 100B in the group G4 and each circuit element shown in FIG. 6 is similar to the above.

One terminal of each of the photoelectric conversion elements 201, 202, 203, and 204 is grounded. Drain terminals of the first transfer transistors 211, 212, 213, and 214 are coupled respectively to the other terminals of the photoelectric conversion elements 201, 202, 203, and 204. Gate terminals of the first transfer transistors 211, 212, 213, and 214 are coupled to the vertical scanning circuit 300A and are supplied with transfer pulses ΦTX1-1, ΦTX1-2, ΦTX1-3, and ΦTX1-4, respectively.

One terminal of the charge retention unit 230 is coupled to source terminals of the first transfer transistors 211, 212, 213, and 214. The other terminal of the charge retention unit 230 is grounded. A drain terminal of the first reset transistor 220 is coupled to a power voltage VDD. A source terminal of the first reset transistor 220 is coupled to the source terminals of the first transfer transistors 211, 212, 213, and 214. A gate terminal of the first reset transistor 220 is coupled to the vertical scanning circuit 300A and is supplied with a reset pulse ΦRST1.

A drain terminal of the first amplifier transistor 240 is coupled to the power voltage VDD. A gate terminal of the first amplifier transistor 240, which is an input unit thereof, is coupled to the source terminals of the first transfer transistors 211, 212, 213, and 214. One end of the current source 280 is coupled to the source terminal of the first amplifier transistor 240. The other end of the current source 280 is grounded. As an example, the current power 280 may include a transistor having: a drain terminal coupled to the source terminal of the first amplifier transistor 240; a source terminal grounded; and a gate terminal coupled to the vertical scanning circuit 300A. One terminal of the clamp capacitor 260 is coupled to the source terminal of the first amplifier transistor 240 and the one end of the current source 280 via the coupler 250.

Drain terminals of the second transfer transistors 271, 272, 273, and 274 are coupled to the other terminal of the clamp capacitor 260. Gate terminals of the second transfer transistors 271, 272, 273, and 274 are coupled to the vertical scanning circuit 300B and are supplied with transfer pulses ΦTX2-1, ΦTX2-2, ΦTX2-3, and ΦTX2-4, respectively.

Drain terminals of the second reset transfer transistors 221, 222, 223, and 224 are coupled to the power voltage VDD. Source terminals of the second reset transfer transistors 221, 222, 223, and 224 are coupled to the source terminals of the second transfer transistors 271, 272, 273, and 274, respectively. Gate terminals of the second reset transfer transistors 221, 222, 223, and 224 are coupled to the vertical scanning circuit 300B, and are supplied with reset pulses ΦRST2-1, ΦRST2-2, ΦRST2-3, and ΦRST2-4, respectively.

One terminal of each of the analog memories 231, 232, 233, and 234 is coupled to the source terminal of the corresponding one of the second transfer transistors 271, 272, 273, and 274. The other terminals of the analog memories 231, 232, 233, and 234 are grounded. Drain terminals of the second amplifier transistors 241, 242, 243, and 244 are coupled to the power voltage VDD. Gate terminals of the second amplifier transistors 241, 242, 243, and 244, which are input units thereof, are coupled respectively to the source terminals of the second transfer transistors 271, 272, 273, and 274. Drain terminals of the select transistors 291, 292, 293, and 294 are coupled respectively to the source terminals of the second amplifier transistors 241, 242, 243, and 244. Source terminals of the select transistors 291 and 293 are coupled to the vertical signal lines 120 in odd-numbered columns Source terminals of the select transistors 292 and 294 are coupled to the vertical signal lines 120 in even-numbered columns Gate terminals of the select transistors 291, 292, 293, and 294 are coupled to the vertical scanning circuit 300B, and are supplied with select pulses $\Phi$SEL1, $\Phi$SEL2, $\Phi$SEL, and $\Phi$SEL4, respectively. Regarding each of the above transistors, the polarity thereof may be reversed, and the source terminal and the drain terminal may be reversed.

The photoelectric conversion elements 201, 202, 203, and 204 are, for example, photodiodes. The photoelectric conversion elements 201, 202, 203, and 204 generate signal charge based on the incident light, and store the generated signal charge. The first transfer transistors 211, 212, 213, and 214 are transistors that transfer to the charge retention unit 230, signal charge stored in the photoelectric conversion elements 201, 202, 203, and 204. The first transfer transistors 211, 212, 213, and 214 are on/off controlled by the transfer pulses $\Phi$TX1-1, $\Phi$TX1-2, $\Phi$TX1-3, and $\Phi$TX1-4 which are supplied from the vertical scanning circuit 300A. The charge retention unit 230 is a floating diffusion capacitor that temporarily stores the signal charge transferred from the photoelectric conversion elements 201, 202, 203, and 204.

The first reset transistor 220 is a transistor that resets the charge retention unit 230. The first reset transistor 220 is on/off controlled by the reset pulse $\Phi$RST1 supplied from the vertical scanning circuit 300A. It is possible to simultaneously turn on the first reset transistor 220 and the first transfer transistors 211, 212, 213, and 214, thereby resetting the photoelectric conversion elements 201, 202, 203, and 204. Resetting of the charge retention unit 230 or the photoelectric conversion elements 201, 202, 203, and 204 is to control the amount of charge stored in the charge retention unit 230 or the photoelectric conversion elements 201, 202, 203, and 204, thereby setting a state (voltage) of the charge retention unit 230 or the photoelectric conversion elements 201, 202, 203, and 204 to a reference state (the reference voltage, the reset level).

The first amplifier transistor 240 is a transistor that receives from the gate terminal thereof and amplifies, a signal based on the signal charge stored in the charge retention unit 230, and outputs the amplified signal from the source terminal thereof. The current source 280 operates as a load for the first amplifier transistor 240. The current source 280 supplies to the first amplifier transistor 240, a current that drives the first amplifier transistor 240. The first amplifier transistor 240 and the current source 280 constitute a source follower circuit.

The clamp capacitor 260 is a capacitor that clamps (fixes) the voltage level of the amplified signal output from the first amplifier transistor 240. The second transfer transistors 271, 272, 273, and 274 are transistors that sample-holds the voltage level of the other terminal of the clamp capacitor 21, and stores the voltage level in the analog memories 231, 232, 233, and 234. The second transfer transistors 271, 272, 273, and 274 are on/off controlled by transfer pulses $\Phi$TX2-1, $\Phi$TX2-2, $\Phi$TX2-3, and $\Phi$TX2-4, which are supplied from the vertical scanning circuit 300B.

The second reset transistors 221, 222, 223, and 224 are transistors that respectively reset the analog memories 231, 232, 233, and 234. The second reset transistors 221, 222, 223, and 224 are on/off controlled respectively by reset pulses $\Phi$RST2-1, $\Phi$RST2-2, $\Phi$RST2-3, and $\Phi$RST2-4, which are supplied from the vertical scanning circuit 300B. Resetting of the analog memories 231, 232, 233, and 234 is to control the amount of charge stored in analog memories 231, 232, 233, and 234, thereby setting the states of the analog memories 231, 232, 233, and 234 to reference states (the reference voltages, the reset levels). The analog memories 231, 232, 233, and 234 store the analog signals sample-hold by the second transfer transistors 271, 272, 273, and 274.

Capacitances of the analog memories 231, 232, 233, and 234 are set to be larger than that of the charge retention unit 230. Preferably, a MIM (metal insulator metal) capacitor or a MOS (metal oxide semiconductor) capacitor, which is a capacitor with little leak current (dark current) per unit area, is used as the analog memories 231, 232, 233, and 234. Thereby, tolerance to noises is increased, thereby achieving high-quality signals.

The second amplifier transistors 241, 242, 243, and 244 are transistors that receive from the gate terminals thereof and amplify, signals based on signal charge stored in the analog memories 231, 232, 233, and 234, and output the amplified signals from the source terminals thereof. The second amplifier transistors 241, 242, 243, and 244 and the current source 130 constitute a source follower circuit. The select transistors 291, 292, 293, and 294 are transistors that select pixels 100B and transfer the outputs of second amplifier transistors 241, 242, 243, and 244 to the vertical signal line 120. The select transistors 291, 292, 293, and 294 are on/off controlled respectively by select pulses $\Phi$SEL1, $\Phi$SEL2, $\Phi$SEL3, and $\Phi$SEL4, which are supplied from the vertical scanning circuit 300B.

The coupler 250 is disposed between the first substrate 20 and the second substrate 21. The amplified signal output from the first amplifier transistor 240 on the first substrate 20 is output to the second substrate 21 via the coupler 250.

In the case of FIG. 6, the coupler 250 is disposed on a path coupling the source terminal of the first amplifier transistor 240, the one end of the current power 280, and the one terminal of the clamp capacitor 260. However, the configuration of the coupler 250 is not limited thereto. The coupler 250 may be disposed at any point on a path electrically coupling the first transfer transistors 211, 212, 213, and 214 respectively to the second transfer transistors 271, 272, 273, and 274.

For example, the coupler 250 may be disposed on a path coupling the source terminals of the first transfer transistors 211, 212, 213, and 214, the one terminal of the charge retention unit 230, the source terminal of the first reset transistor 220, and the gate terminal of the first amplifier transistor 240. Alternatively, the coupler 250 may be disposed on a path coupling the other terminal of the clamp capacitor 260 and the drain terminals of the second transfer transistors 271, 272, 273, and 274.

Figure 7:
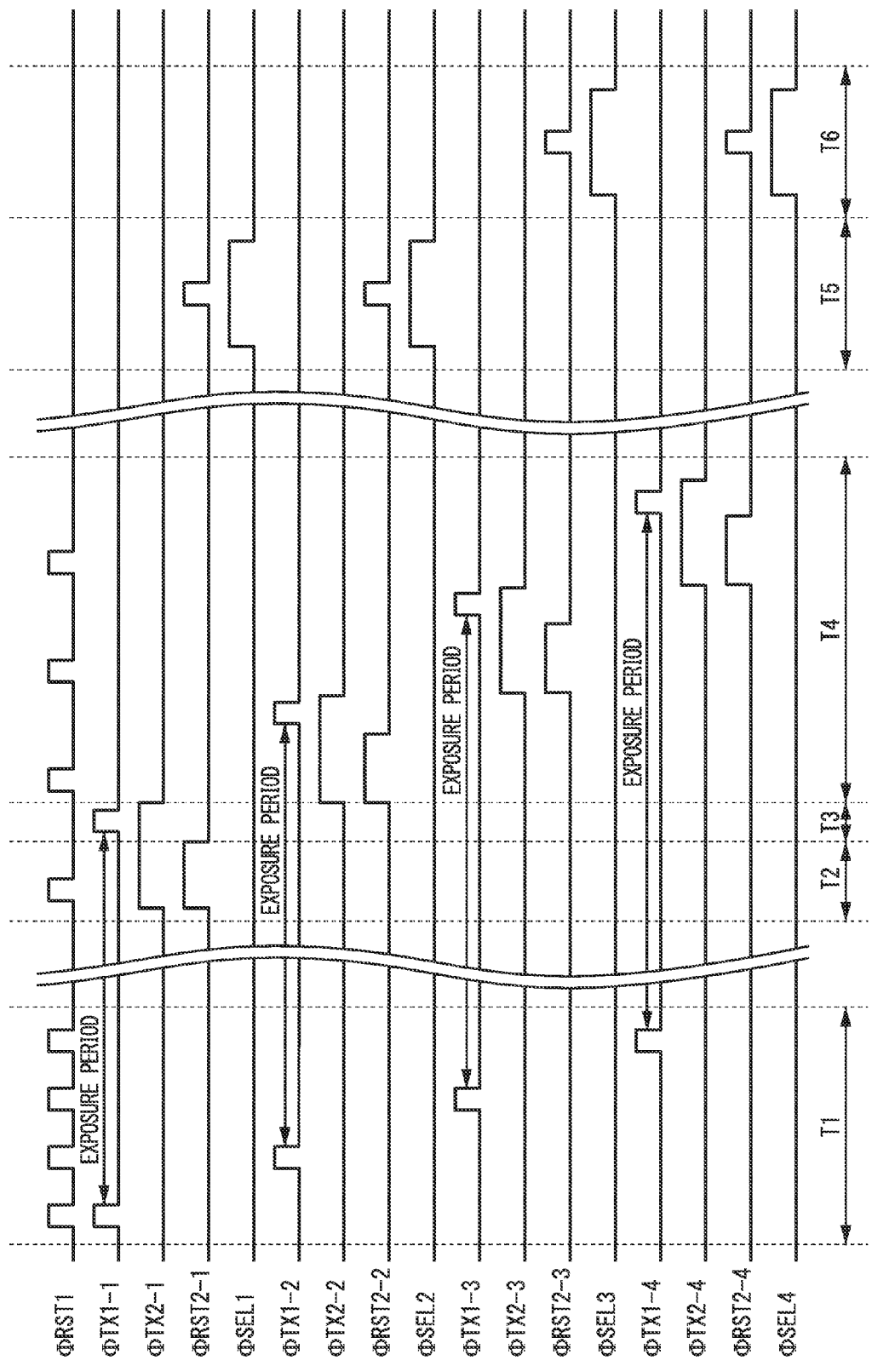
FIG. 7 is a timing chart illustrating operation of pixels included in the solid-state image pickup device according to the first embodiment of the present invention.

Hereinafter, operation of the pixels 100A and 100B is explained with reference to FIG. 7. FIG. 7 illustrates control signals supplied from the vertical scanning circuits 300A and 300B to the pixels 100A and 100B in units of rows. Hereinafter, operations are explained with respect to the group of the four pixels 100A and the group of the four pixels 100B.

[Operation in Period T1]

Firstly, the reset pulse ΦRST1 changes from "L" (low) level to "H" (high) level, thereby turning on the first reset transistor 220. At the same time, the transfer pulse ΦTX1-1 changes from "L" level to "H" level, thereby turning on the first transfer transistor 211. Thus, the photoelectric conversion element 201 is reset.

Then, the reset pulse ΦRST1 and the transfer pulse ΦTX1-1 change from "H" level to the "L" level, thereby turning off the first reset transistor 220 and the first transfer resistor 211. Thus, the resetting of the photoelectric element 201 ends, and then exposure of the photoelectric conversion element 201 (storing of the signal charge) starts. In a similar manner to the above, the photoelectric conversion elements 202, 203, and 203 are subsequently reset, and exposure of each photoelectric conversion element starts. In the case of FIG. 7, the reset pulse ΦRST1 becomes "H" level at the timing of the transfer pulses ΦTX1-1, ΦTX1-2, ΦTX1-3, and ΦTX1-4 becoming "H" level. However, the reset pulse ΦRST1 may maintain "H" level in the period of resetting the photoelectric conversion elements 201, 202, 203, and 204.

[Operation in Period T2]

Then, the reset pulse ΦRST2-1 changes from "L" level to "H" level, thereby turning on the second reset transistor 221. Thus, the analog memory 231 is reset. At the same time, a sample pulse ΦTX2-1 changes from "L" level to "H" level, thereby turning on the second transfer transistor 271. Thus, the voltage of the other terminal of the clamp capacitor 260 is reset to the power voltage VDD, and the second transfer transistor 271 starts to sample-hold the voltage of the other terminal of the clamp capacitor 260.

Then, the reset pulse ΦRST1 changes from "L" level to "H" level, thereby turning on the first reset transistor 220. Thus, the charge retention unit 230 is reset. Then, the reset pulse ΦRST1 changes from "H" level to "L" level, thereby turning off the first reset transistor 220. Thus, the resetting of the charge retention unit 230 ends. The timing of resetting the charge retention unit 230 may be in the period of exposure. If the charge retention unit 230 is reset in the timing immediately before the end of the exposure period, however, it is possible to reduce more noises caused by leak current of the charge retention unit 230.

Then, the reset pulse RST2-1 changes from "H" level to "L" level, thereby turning off the second reset transistor 221. Thus, the resetting of the analog memory 231 ends. At this time, the clamp capacitor 260 has clamped the amplified signal (the amplified signal after the charge retention unit 230 is reset) output from the first amplified transistor 240.

[Operation in Period T3]

Firstly, the transfer pulse ΦTX1-1 changes from "L" level to "H" level, thereby turning on the first transfer transistor 211. Thus, the signal charge stored in the photoelectric conversion element 201 is transferred to the charge retention unit 230 via the first transfer transistor 211, and is stored in the charge retention unit 230. Thereby, the exposure (storing of the signal charge) ends. The period from the start of the exposure in the period T1 to the end of the exposure in the period T3 is the exposure period (signal storing period). Then, the transfer pulse ΦTX1-1 changes from "H" level to "L" level, thereby turning off the first transfer transistor 211.

Then, the transfer pulse ΦTX2-1 changes from "H" level to "L" level, thereby turning off the second transfer transistor 271. Thus, the second transfer transistor 271 terminates sample-holding of the voltage of the other terminal of the clamp capacitor 260.

[Operation in Period T4]

The operations in the aforementioned periods T2 and T3 are operations of the one pixel 100A among the four pixels 100A forming one group. In the period T4, similar operations to those in the periods T2 and T3 are performed with respect to the remaining three pixels 100A. Preferably, the length of the exposure period for each pixel is set to be identical.

Hereinafter, a change in the voltage of the one terminal of the analog memory 231 is explained. A change in the one terminal of each of the other analog memories 232, 233, and 234 is similar. The change ΔVamp1 in the voltage of the source terminal of the first amplifier transistor 240, which is caused by the signal charge being transferred from the photoelectric conversion element 201 to the charge retention unit 230, equals α1×ΔVfd where ΔVfd denotes a change in the voltage of the one terminal of the charge retention unit 230 which is caused by the signal charge being transferred from the photoelectric conversion element 201 to the charge retention unit 230 after the resetting of the charge retention unit 230 ends, and α1 denotes a gain of the first amplifier transistor 240.

A change ΔVmem in the voltage of the one terminal of the analog memory 231, which is caused by sample-holding by the second transfer transistor 271 after the signal charge is transferred from the photoelectric conversion element 201 to the charge retention unit 230 equals α2×ΔVamp1, that is, α1×α2×ΔVfd, where α2 denotes the total gain of the analog memory 231 and the second transfer transistor 271. The voltage of the one terminal of the analog memory 231 at the time when the resetting of the analog memory 231 ends is the power voltage VDD. For this reason, the voltage Vmem of the one terminal of the analog memory 231 sample-hold by the second transfer transistor 271 after the signal charge is transferred from the photoelectric conversion element 201 to the charge retention unit 230, is expressed as in the following equation (1). In equation (1), ΔVmem<0 and ΔVfd<0.

$$Vmem = VDD + \Delta Vmem \quad (1)$$
$$= VDD + \alpha 1 \times \alpha 2 \times \Delta Vfd$$

Additionally, α2 is expressed as in the following equation (2). In equation (2), CL denotes a capacitance value of the clamp capacitor 260, and CSH denotes a capacitance value of the analog memory 231. In order to further reduce a decrease in the gain, the capacitance CL of the clamp capacitor 260 is preferably larger than the capacitance CSH of the analog memory 231.

$$\alpha 2 = \frac{CL}{CL + CSH} \quad (2)$$

[Operation in Period T5]

In periods T5 and T6, signals based on the signal charge stored in the analog memories 231, 232, 233, and 234 are read every two rows. Firstly, signals are read from the two pixels 100B arranged in the same row, which are two pixels of the four pixels 100B included in one group. The select pulses ΦSEL1 and ΦSEL2 change from "L" level to "H" level, thereby turning on the select transistors 291 and 292. Thus, signals based on the voltage Vmem shown in equation (1) are output to the vertical signal lines 120 via the select transistors 291 and 292.

Then, the reset pulses ΦRST2-1 and ΦRST2-2 change from "L" level to "H" level, thereby turning on the second reset transistors 221 and 222. Thus, the analog memories 231 and 232 are reset, and the signal based on the voltage of the one terminal of each of the analog memories 231 and 232 at the time of the resetting is output to the corresponding one of the vertical signal lines 120 via the corresponding one of the select transistors 291 and 292.

Then, the reset pulses ΦRST2-1 and ΦRST2-2 change from "H" level to "L" level, thereby turning off the second reset transistors 221 and 222. Then, the select pulses ΦSEL1 and ΦSEL2 change from "H" level to "L" level, thereby turning off the select transistors 291 and 292.

The column processing circuit 350 generates a difference signal by calculating the difference between the signal based on the voltage Vmem shown in equation (1) and the signal based on the voltage of the one terminal of each of the analog memories 231 and 232 at the time when the analog memories 231 and 232 are reset. This difference signal is a signal based on the difference between the voltage Vmem shown in equation (1) and the power voltage VDD, that is, the signal based on the difference ΔVfd between the voltage of the one terminal of the charge retention unit 230 immediately after the signal charge stored in the photoelectric conversion elements 201 and 202 are transferred to the charge retention unit 230, and the voltage of the charge retention unit 230 immediately after the one terminal of the charge retention unit 230 is reset. Accordingly, a signal element based on the signal charge stored in the photoelectric conversion elements 201 and 202 can be obtained while suppressing the noise element caused by resetting the analog memories 231 and 232, and the noise element caused by resetting the charge retention unit 230.

The horizontal scanning circuit 400 inputs the signals output from the column processing circuits 350, to the output amplifiers 410 and 420 via the output channels 430 and 440. The output amplifiers 410 and 420 process the input signals, and output the processed signals as image signals. Thus, the reading of the signals from the two pixels 100B arranged in the same row, which are two pixels of the four pixels 100B included in one group, ends.

[Operation in Period T6]

Subsequently, operation similar to the operation of the pixels 100B in period T5 is performed with respect to the remaining two pixels 100B.

In the above operation, the charge retention unit 230 must store the signal charge transferred from the photoelectric conversion elements 201, 202, 203, and 204 until the reading timing for each pixel 100A. If noise occurs while the charge retention unit 230 stores the signal charge, that noise is superimposed on the signal charge stored by the charge retention unit 230, thereby causing deterioration of signal quality (S/N).

Primary factors for noises occurring in a period for the charge retention unit 230 to store the signal charge (hereinafter referred to as "retention period") are charge resulting from leak current of the charge retention unit 230 (hereinafter referred to as leak charge) and charge resulting from the light entering a portion other than the photoelectric conversion elements 201, 202, 203, and 204 (hereinafter referred to as light charge). Noise charge Qn occurring during the retention period equals (qid+qpn)tc where qid and qpn denote the leak charge per unit time and the light charge per unit time, respectively.

The capacitance of the charge retention unit 230 is denoted as Cfd. The capacitances of the analog memories 231, 232, 233, and 244 are denoted as Cmem. A ratio of Cfd to Cmem, that is, (Cmem/Cfd), is denoted as A. As explained above, the gain of the first amplifier transistor 240 is denoted as α1. The total gain of the analog memories 231, 232, 233, and 234 and the second transfer transistors 271, 272, 273, and 274 is denoted as α2. The signal charge stored in the analog memories 231, 232, 233, and 234 after the exposure period ends equals A×α1×α2×Qph where Qph denotes the signal charge generated by the photoelectric conversion elements 201, 202, 203, and 204 during the exposure period.

The signals based on the signal charge transferred from the photoelectric conversion elements 201, 202, 203, and 204 to the charge retention unit 230 are sample-hold by the second transfer transistors 271, 272, 273, and 274 and stored in the analog memories 231, 232, 233, and 234. Accordingly, the duration from the time the signal charge is transferred to the charge retention unit 230 to the time the signal charge is stored in the analog memories 231, 232, 233, and 234 is short. For this reason, the noises generated in the charge retention unit 230 are negligible. If noise generated while the analog memories 231, 232, 233, and 234 store signal charge is assumed to be the same Qn as the above, S/N equals A×α1×α2×Qph/Qn.

On the other hand, in a case where the signal charge stored in the charge retention unit is read from the pixel via the amplifier transistor, as in the case of the related art disclosed in Japanese Patent Laid-Open Publication No. 2010-219339, S/N equals Qph/Qn. Accordingly, S/N in the first embodiment equals A×α1×α2 times the S/N in the case of the related art. The capacitance values of the analog memories 231, 232, 233, and 234 are set so that A×α1×α2 exceeds 1 (for example, the capacitance values of the analog memories 231, 232, 233, and 234 are set to be much greater than the capacitance value of the charge retention unit 230), thereby enabling a reduction in deterioration of signal quality.

In the first embodiment, the groups of the pixels 100A have the same operational timing regardless of the positions thereof in the vertical direction (hereinafter referred to as the vertical position). Additionally, the groups of the pixels 100B at the different vertical positions have different operational timings in accordance with the respective operational periods.

Figure 8:
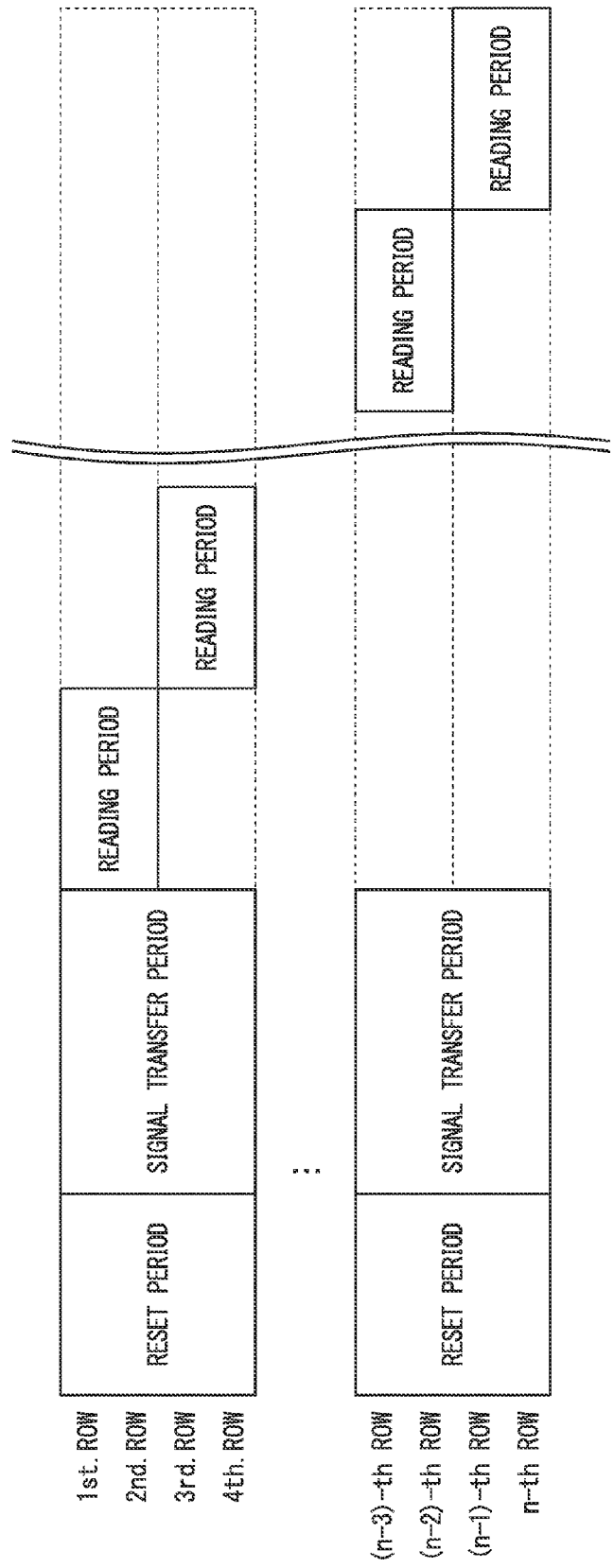
FIG. 8 is a timing chart illustrating operation of pixels included in the solid-state image pickup device according to the first embodiment of the present invention.

FIG. 8 schematically illustrates the operational timing per group in a case where the pixels 100A and 100B are arranged in n rows. In FIG. 8, positions in the vertical direction denote the vertical positions in the arrangement of the pixels 100A and 100B, that are, row positions. Additionally, positions in the horizontal direction denote the time positions.

The reset period corresponds to the period T1 shown in FIG. 7. The signal transfer period corresponds to the periods T2, T3, and T4 shown in FIG. 7. The reading period corresponds to the periods T5 and T6 shown in FIG. 7. The groups of the pixels 100A have the same reset period and the same signal transfer period, regardless of the vertical positions thereof. On the other hand, the groups of the pixels 100B at the different vertical positions have the same signal transfer period, but have different reading periods. In the aforementioned operation, the exposure timing differs for each pixel included in the same group, but synchronization of the exposure can be achieved for the entire group.

Hereinafter, a modified example of the first embodiment is explained. In the first embodiment, the four pixels 100A arranged in four rows and one column on the first substrate 20 form one group. However, arrangement of the pixels 100A forming one group is not limited thereto. Also in the first embodiment, the four pixels 100B arranged in two rows and two columns on the second substrate 21 form one group. However, arrangement of the pixels 100B forming one group is not limited thereto, as long as the group of the pixels 100B is determined so that signal charge generated by the photoelectric conversion elements in the pixels 100A corresponding to the same color are stored in the analog memories in the pixels 100B arranged in the same column.

FIGS. 9A and 9B illustrate another example of groups of the pixels 100A and groups of the pixels 100B. FIG. 9A illustrates groups of the pixels 100A. FIG. 9B illustrates groups of the pixels 100B. FIG. 9A shows arrangement of only a part of the pixels 100A included in the pixel unit 200A, and FIG. 9B shows arrangement of only a part of the pixels 100B included in the pixel unit 200B. However, arrangement of the remaining pixels 100A and arrangement of the remaining pixels 100B are similar to those shown in FIGS. 9A and 9B.

As shown in FIG. 9A, on the first substrate 20, the four pixels 100A arranged in two rows and two columns share one coupler 250. Specifically, the pixel 100A-11 corresponding to B, the pixel 100A-12 corresponding to Gr, the pixel 100A-15 corresponding to Gb, and the pixel 100A-16 corresponding to R share the coupler 250-1. Those pixels 100A-11, 100A-12, 100A-15, and 100A-16 constitute a group G11. Additionally, the pixel 100A-13 corresponding to B, the pixel 100A-14 corresponding to Gr, the pixel 100A-17 corresponding to Gb, and the pixel 100A-18 corresponding to R share the coupler 250-2. Those pixels 100A-13, 100A-14, 100A-17, and 100A-18 constitute a group G12.

As shown in FIG. 9B, on the second substrate 21, the four pixels 100B arranged in two rows and two columns share one coupler 250. Specifically, the pixel 100B-11 corresponding to B, the pixel 100B-12 corresponding to R, the pixel 100B-15 corresponding to Gb, and the pixel 100B-16 corresponding to Gr share the coupler 250-1. Those pixels 100B-11, 100B-12, 100B-15, and 100B-16 constitute a group G13. Additionally, the pixel 100B-13 corresponding to B, the pixel 100B-14 corresponding to R, the pixel 100B-17 corresponding to Gb, and the pixel 100B-18 corresponding to Gr share the coupler 250-2. Those pixels 100B-13, 100B-14, 100B-17, and 100B-18 constitute a group G14. As explained above, arrangements of the couplers 250 and groups are determined so that the total four pixels in the one group on the first substrate 20 respectively overlap the four pixels in the one group on the second substrate 21.

The pixels 100A in the group G11 correspond respectively to the pixels 100B in the group G13. In other words, signal charge generated by the pixel 100A in the group G11 is input to and stored in the corresponding pixel 100B in group G13 via the coupler 250-1. Additionally, the pixels 100A in the group G12 correspond respectively to the pixels 100B in the group G14. In other words, signal charge generated by the pixel 100A in the group G12 is input to and stored in the corresponding pixel 100B in group G14 via the coupler 250-2. The vertical scanning circuits 300A and 300B correspond the pixels 100A in the group G11 respectively to the pixels 100B in the group G13, and correspond the pixels 100A in the group G12 respectively to the pixels 100B in the group G14. The vertical scanning circuits 300A and 300B generate control signals that control the pixels 100A and 100B, and output the control signals to the pixels 100A and 100B via the signal lines 110A and 110B.

As shown in FIG. 9B, the pixels 100B-11 and 100B-13 corresponding to B and the pixels 100B-12 and 100B-14 corresponding to R are arranged in the same column Pixel signals (B signals, R signals) output from those pixels are processed by the column processing circuit 350, and then are output to the output amplifier 410 via the output channel 430. Additionally, the pixels 100B-15 and 100B-17 corresponding to Gb and the pixels 100B-16 and 100B-18 corresponding to Gr are arranged in the same column Pixel signals (G signals) output from those pixels are processed by the column processing circuit 350, and then are output to the output amplifier 420 via the output channel 440.

As explained above, in the first embodiment, on the second substrate 21, two or more pixels 100B corresponding to the same color are arranged in the same column. Alternatively, on the second substrate 21, the arrangement of the colors corresponding to multiple pixels 100A differs from the arrangement of the colors corresponding to multiple pixels 100B. Alternatively, the signal (color signal) generated by the photoelectric conversion element in each of the multiple pixels 100A corresponding to the same color is stored in the corresponding one of the multiple analog memories (signal storing circuits) coupled to the same vertical signal line 120.

According to such the configuration of the solid-state image pickup device, it is possible to prevent a variation between pixel signals corresponding to the same color, which occurs in the step of reading the pixel signals. Accordingly, it is possible to prevent longitudinal stripes from being included in an image formed by the read pixel signals. With respect particularly to the color of green (Gr, Gb) to which the human eyes have higher sensitivity than to the other colors, it is possible to prevent a variation between pixel signals corresponding to the same color, which occurs in the step of reading the pixel signals, and to prevent longitudinal stripes from being included in an image formed by the read pixel signals.

Additionally, some circuit elements are shared by multiple pixels, thereby enabling a reduction in chip area compared to in a case where no circuit element is shared by multiple pixels. Further, the first amplifier transistor 240 and the current source 280 are shared by the multiple pixels, thereby reducing the number of current sources which simultaneously operate. For this reason, it is possible to reduce voltage drop of the power voltage which is caused by multiple current sources operating simultaneously, an increase in GND voltage, and the like.

Moreover, it is possible to increase the areas of the photoelectric conversion elements on the first substrate 20, compared to a case where all circuit elements constituting pixels are arranged on one substrate, thereby enhancing the sensitivity. Further, by use of the analog memories, it is possible to reduce the area of the region for storing signal charge, on the second substrate 21.

Additionally, the analog memories 231, 232, 233, and 234 are provided, thereby reducing deterioration of the signal quality. Particularly, the capacitance value of the analog memory is set to be greater than the capacitance value of the charge retention unit (for example, the capacitance value of the analog memory is set to be five times or more the capacitance value of the charge retention unit). Thereby, the signal charge stored in the analog memory is larger than the signal charge stored in the charge retention unit. For this reason, it is possible to reduce the effect of the deterioration of the signal quality due to leak current from the analog memory.

Further, the clamp capacitor 260 and the second transfer transistors 271, 272, 273, and 274 are provided, thereby reducing the effect of the noises occurring in the first substrate 20. The noises generated in the first substrate 20 include: noise (such as reset noise) generated in the input unit of the first amplifier transistor 240, which results from operation of a circuit coupled to the first amplifier transistor 240 (such as the first reset transistor 220); noise (such as noise resulting from a variation in circuit threshold of the first amplifier transistor 240) resulting from the operational property of the first amplifier transistor 240; and the like.

Moreover, the signal at the time of resetting the analog memories 231, 232, 233, and 234, and the signal according to the change in the outputs of the first amplifier transistor 240 which is caused by the signal charge being transferred from the photoelectric conversion elements 201, 202, 203, and 204 to the charge retention unit 230, are output by time division from the pixel 100B. Then, the process of calculating the difference between those signals is performed outside the pixel 100B, thereby reducing noises generated in the second substrate 21. The noises generated in the second substrate 21 include noise (such as reset noise) generated in the input units of the second amplifier transistors 241, 242, 243, and 244, which results from operations of circuits coupled to the second amplifier transistors 241, 242, 243, and 244 (such as the second reset transistors 241, 242, 243, and 244), and the like.

Second Embodiment

Similar to the digital camera 10 according to the first embodiment, a digital camera as an example of an image pickup device, to which a solid-state image pickup device according to a second embodiment of the present invention is applied, includes: the lens unit 1; the lens control device 2; a solid-state image pickup device 3'; the drive circuit 4; the memory 5; the signal processing circuit 6; the recording device 7; the control device 8; and the display device 9. However, the second embodiment differs from the first embodiment only in a configuration of the solid-state image pickup device 3'. Therefore, only the solid-state image pickup device 3' is explained. Regarding the solid-state image pickup device 3', like reference numerals denote like elements between the first and second embodiments, and explanations of the same elements as those of the first embodiment are omitted here.

Figure 10:
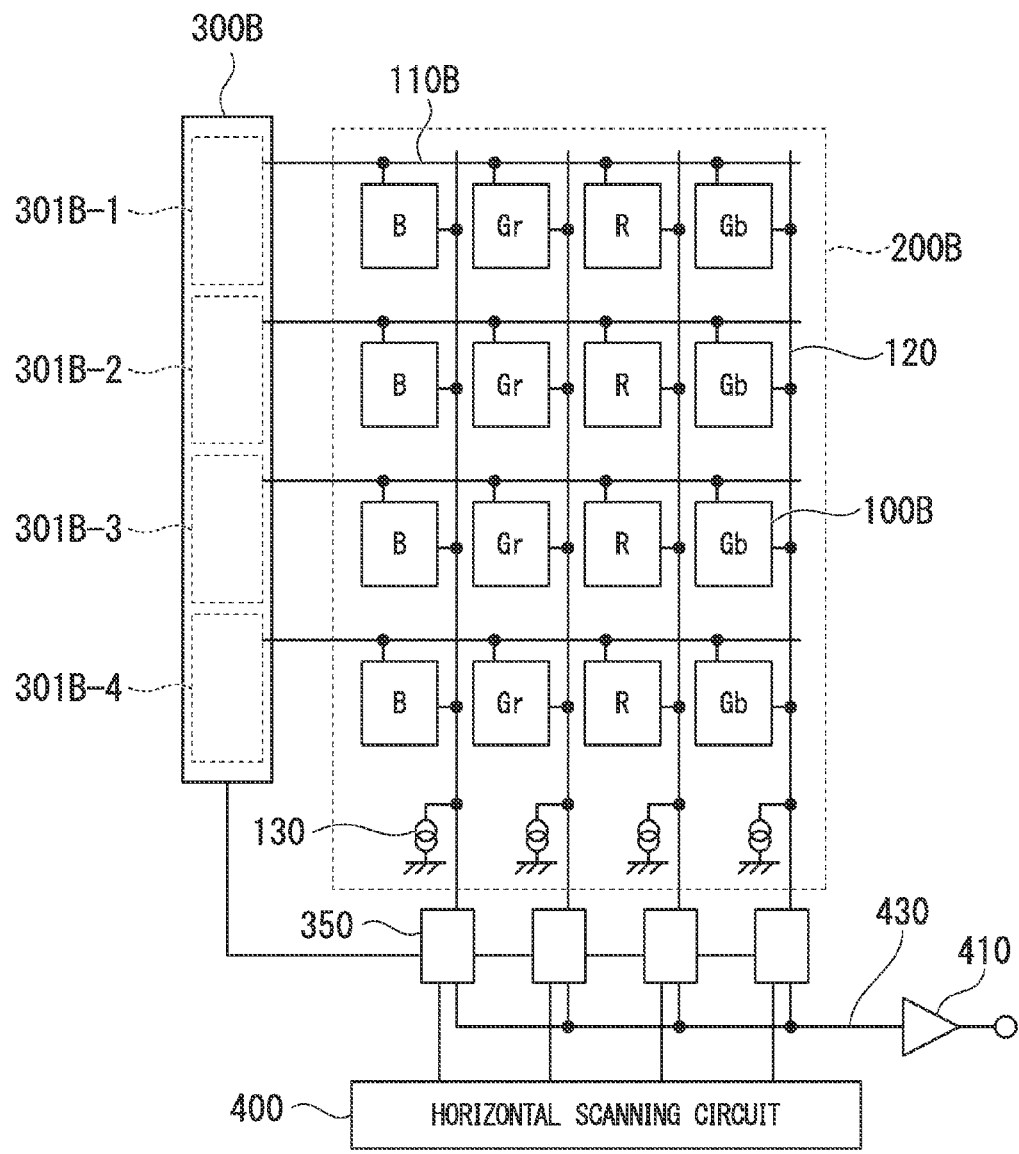
FIG. 10 is a block diagram illustrating a configuration of a solid-state image pickup device according to a second embodiment of the present invention.

FIG. 10 illustrates a configuration of the solid-state image pickup device 3' in the second substrate 21. Regarding the configuration of the solid-state image pickup device 3 of the first embodiment shown in FIG. 4, the pixels 100B corresponding to R and the pixels 100B corresponding to B are arranged in odd-numbered columns. Further, the pixels 100B corresponding to Gr and the pixels 100B corresponding to Gb are arranged in even-numbered columns.

On the other hand, regarding the configuration of the solid-state image pickup device 3' of the second embodiment shown in FIG. 10, the pixels 100B corresponding to B are arranged in the first column. The pixels 100B corresponding to Gr are arranged in the second column. The pixels 100B corresponding to R are arranged in the third column. The pixels 100B corresponding to Gr are arranged in the fourth column.

Additionally, regarding the configuration of the solid-state image pickup device 3 of the first embodiment shown in FIG. 4, the column processing circuits 350 provided respectively for odd-numbered columns are coupled to the output channel 430 (the horizontal signal line, the output signal line). Further, the column processing circuits 350 provided respectively for even-numbered columns are coupled to the output channel 440 (the horizontal signal line, the output signal line). Moreover, the output amplifier 410 is coupled to the output channel 430, and the output amplifier 420 is coupled to the output channel 440.

On the other hand, regarding configuration of the solid-state image pickup device 3' of the second embodiment shown in FIG. 10, the output channel 440 and the output amplifier 420 are not included. Further, the output channel 430 (a horizontal signal line, an output signal line) is coupled to the column processing circuits 350 provided respectively for the columns, and the output amplifier 410 is coupled to the output channel 430.

Figure 11A:
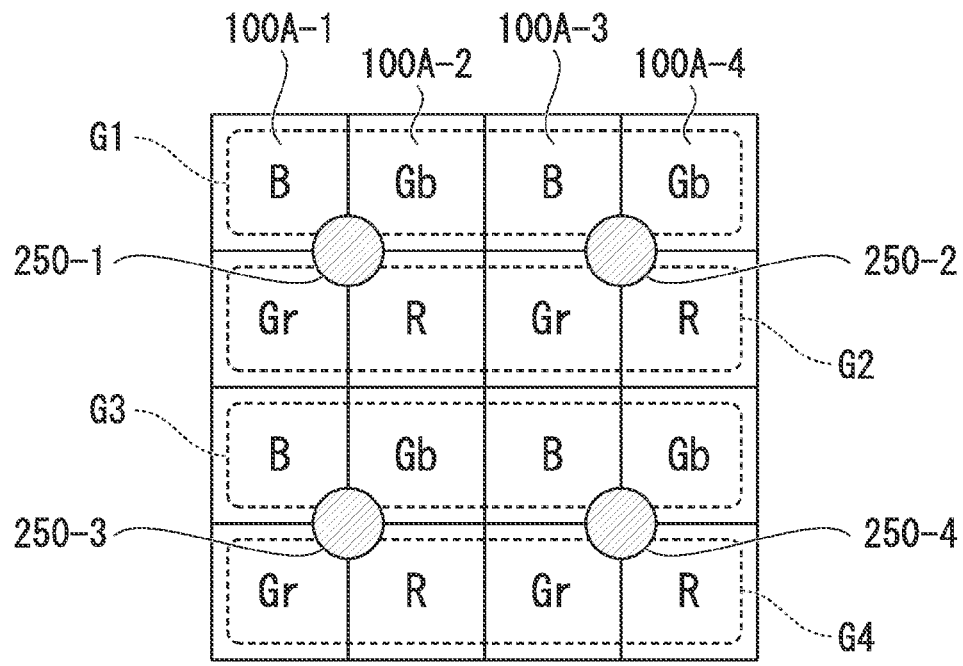
FIGS. 11A and 11B are reference diagrams illustrating an example of groups of pixels included in the solid-state image pickup device according to the second embodiment of the present invention.
Figure 11B:
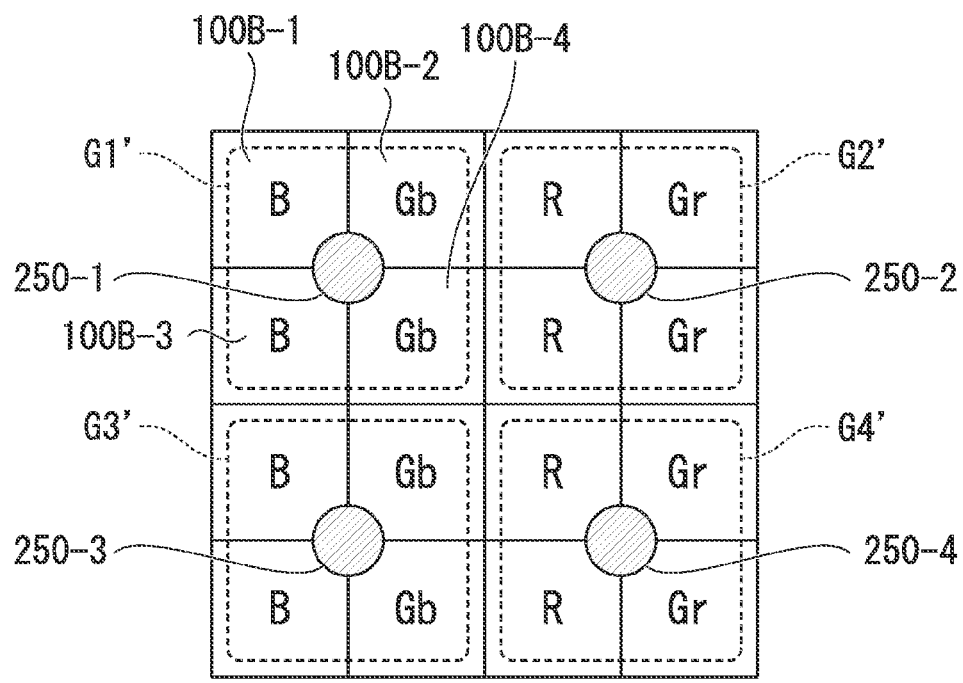

In the second embodiment, similar to the first embodiment, the multiple pixels 100A share one coupler 250, and the multiple pixels 100B share one coupler 250. Additionally, the multiple pixels 100A sharing the one coupler 250 are grouped into one group. The multiple pixels 100B sharing the one coupler 250 are grouped into one group. FIG. 11A illustrates groups of the pixels 100A and FIG. 11B illustrates groups of the pixels 100B. FIG. 11A shows arrangement of only a part of the pixels 100A included in the pixel unit 200A. FIG. 5B shows arrangement of only a part of the pixels 100B included in the pixel unit 200B. However, arrangement of the remaining pixels 100A and arrangement of the remaining pixels 100B are similar to those shown in FIGS. 11A and 11B.

As shown in FIG. 11A, on the first substrate 20, the four pixels 100A arranged in one row and four columns share one coupler 250. Specifically, regarding the arrangement shown in FIG. 11A, the pixels 100A-1 and 100A-3 corresponding to B which are arranged in the first row and the first and third columns, and the pixels 100A-2 and 100A-4 corresponding to Gb which are arranged in the first row and the second and fourth columns, share the coupler 250-1. Those four pixels 100A-1, 100A-2, 100A-3, and 100A-4 constitute a group G1. Additionally, regarding the arrangement shown in FIG. 11A, the two pixels 100A corresponding to Gr which are arranged in the second row and the first and third columns, and the two pixels 100A corresponding to R which are arranged in the second row and the second and fourth columns, share the coupler 250-2. Those four pixels 100A constitute a group G2.

Further, regarding the arrangement shown in FIG. 11A, the two pixels 100A corresponding to B which are arranged in the third row and the first and third columns, and the two pixels 100A corresponding to Gb which are arranged in the third row and the second and fourth columns, share the coupler 250-3. Those four pixels 100A constitute a group G3. Moreover, regarding the arrangement shown in FIG. 11A, the two pixels 100A corresponding to Gr which are arranged in the fourth row and the first and third columns, and the two pixels 100A corresponding to R which are arranged in the fourth row and the second and fourth columns, share the coupler 250-4. Those four pixels 100A constitute a group G4.

As shown in FIG. 11B, on the second substrate 21, the four pixels 100B arranged in two row and two columns share one coupler 250. Specifically, regarding the arrangement shown in FIG. 11B, the pixels 100B-1 and 100B-3 corresponding to B which are arranged in the first and second rows and the first column, and the pixels 100B-2 and 100B-4 corresponding to Gb which are arranged in the first and second rows and the second column, share the coupler 250-1. Those four pixels 100B-1, 100B-2, 100B-3, and 100B-4 constitute a group G1'. Additionally, regarding the arrangement shown in FIG. 11B, the two pixels 100B corresponding to R which are arranged in the first and second rows and the third column, and the two pixels 100B corresponding to Gr which are arranged in the first and second rows and the fourth column, share the coupler 250-2. Those four pixels 100B constitute a group G2'.

Further, regarding the arrangement shown in FIG. 11B, the two pixels 100B corresponding to B which are arranged in the third and fourth rows and the first column, and the two pixels 100B corresponding to Gb which are arranged in the third and fourth rows and the second column, share the coupler 250-3. Those four pixels 100B constitute a group G3'. Moreover, regarding the arrangement shown in FIG. 11B, the two pixels 100B corresponding to R which are arranged in the third and fourth rows and the third column, and the two pixels 100B corresponding to Gr which are arranged in the third and fourth rows and the fourth column, share the coupler 250-4. Those four pixels 100A constitute a group G4'.

As explained above, the arrangements of the couplers 250 and the groups are determined so that the total sixteen pixels in the four groups on the first substrate 20 respectively correspond to the total sixteen pixels in the four groups on the second substrate 21.

The pixels 100A in the group G1 correspond respectively to the pixels 100B in the group G1'. In other words, signal charge generated by the pixel 100A in the group G1 is input to and stored in the corresponding pixel 100B in group G1' via the coupler 250-1. Additionally, the pixels 100A in the group G2 correspond respectively to the pixels 100B in the group G2'. In other words, signal charge generated by the pixel 100A in the group G2 is input to and stored in the corresponding pixel 100B in group G2' via the coupler 250-2.

The pixels 100A in the group G3 correspond respectively to the pixels 100B in the group G1'. In other words, signal charge generated by the pixel 100A in the group G3 is input to and stored in the corresponding pixel 100B in group G1' via the coupler 250-3. Additionally, the pixels 100A in the group G4 correspond respectively to the pixels 100B in the group G4'. In other words, signal charge generated by the pixel 100A in the group G4 is input to and stored in the corresponding pixel 100B in group G4' via the coupler 250-4.

The vertical scanning circuits 300A and 300B correspond the pixels 100A in the group G1 respectively to the pixels 100B in the group G1'. The vertical scanning circuits 300A and 300B correspond the pixels 100A in the group G2 respectively to the pixels 100B in the group G2'. The vertical scanning circuits 300A and 300B correspond the pixels 100A in the group G3 respectively to the pixels 100B in the group G3'. The vertical scanning circuits 300A and 300B correspond the pixels 100A in the group G4 respectively to the pixels 100B in the group G4'. The vertical scanning circuits 300A and 300B generate control signals that control the pixels 100A and 100B, and output the control signals to the pixels 100A and 100B via the signal lines 110A and 110B.

Configurations of the pixels 100A and 100B are the same as those of the first embodiment shown in FIG. 6, and therefore explanations thereof are omitted here. As explained above, however, the pixel 100B, in which the second reset transistor 221 and the select transistor 291 are arranged, corresponds to the pixel 100B-1 shown in FIG. 11B. Additionally, the pixel 100B, in which the second reset transistor 222 and the select transistor 292 are arranged, corresponds to the pixel 100B-2 shown in FIG. 11B. Further, the pixel 100B-1 and the pixel 100B-2 are arranged in the same row. Moreover, operations of the second reset transistors 221 and 222 are simultaneously performed in the period for reading signals, as will be explained later. For this reasons, the reset pulse ΦRST2-1 may be supplied to both the second reset transistors 221 and 222. Additionally, operations of the select transistors 291 and 292 are simultaneously performed in the period for reading signals, as will be explained later. For this reasons, the select pulse ΦSEL1 may be supplied to both the select transistors 291 and 292.

Figure 12:
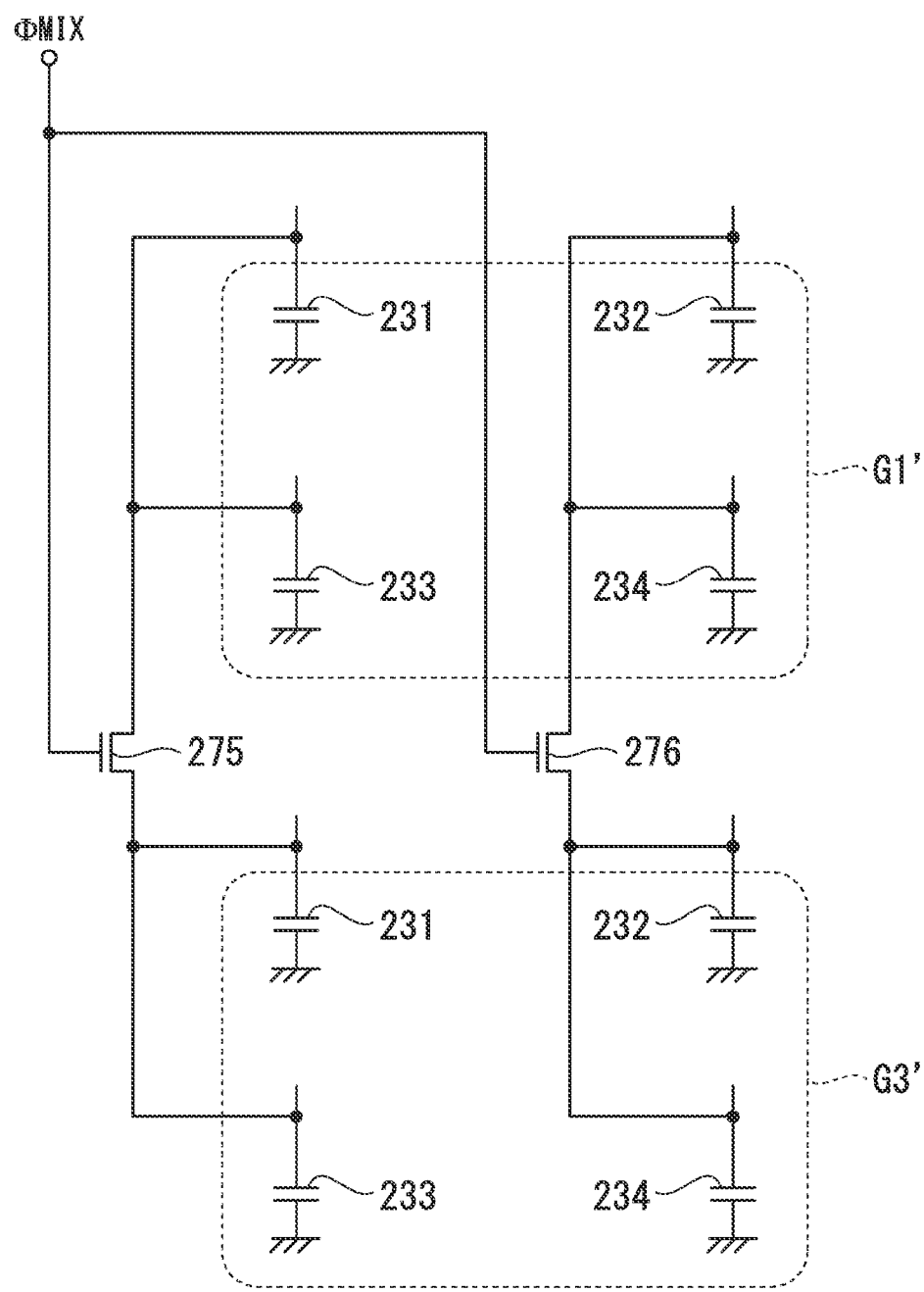
FIG. 12 is a circuit diagram illustrating a configuration of a circuit disposed between pixels included in the solid-state image pickup device according to the second embodiment of the present invention.

FIG. 12 illustrates a configuration of circuits disposed between the pixels 100B arranged on the second substrate 21, with respect only to the pixels 100B in the groups G1' and G3' shown in FIG. 11B. Averaging transistors 275 and 276 are arranged on the second substrate 21. The averaging transistors 275 and 276 perform an averaging process of averaging signal charge stored in the multiple analog memories in the pixel 100B.

One of a source terminal and a drain terminal of the averaging transistor 275 is coupled to one terminal of each of the analog memories 231 and 233 in the pixel 100B in the group G1'. The other one of the source terminal and the drain terminal of the averaging transistor 275 is coupled to one terminal of each of the analog memories 231 and 233 in the pixel 100B in the group G3'. Although not shown, one terminal of each of the analog memories 231 and 233 is coupled to the source terminal of the corresponding one of the second transfer transistors 271 and 273. A gate terminal of the averaging transistor 275 is coupled to the vertical scanning circuit 300B, and is supplied with an averaging pulse ΦMIX.

One of a source terminal and a drain terminal of the averaging transistor 276 is coupled to one terminal of each of the analog memories 232 and 234 in the pixel 100B in the group G1'. The other one of the source terminal and the drain terminal of the averaging transistor 276 is coupled to one terminal of each of the analog memories 232 and 234 in the pixel 100B in the group G3'. Although not shown, one terminal of each of the analog memories 232 and 234 is coupled to the source terminal of the corresponding one of the second transfer transistors 272 and 274. A gate terminal of the averaging transistor 276 is coupled to the vertical scanning circuit 300B, and is supplied with an averaging pulse ΦMIX.

The averaging transistor 275 averages the signal charge stored in each of the analog memories 231 and 233 in the group G1' and the signal charge stored in each of the analog memories 231 and 233 in the group G3'. In other words, the averaging transistor 275 averages the signal charge stored in each of the analog memories in the four pixels 100B corresponding to B which are arranged in the same column. The averaging transistor 275 is on/off controlled by the select pulse ΦMIX supplied from the vertical scanning circuit 300B.

The averaging transistor 276 averages the signal charge stored in each of the analog memories 232 and 234 in the group G1' and the signal charge stored in each of the analog memories 232 and 234 in the group G3'. In other words, the averaging transistor 276 averages the signal charge stored in each of the analog memories in the four pixels 100B corresponding to Gb which are arranged in the same column. The averaging transistor 276 is on/off controlled by the select pulse ΦMIX supplied from the vertical scanning circuit 300B.

Similarly, an averaging transistor that averages the signal charge stored in each of the analog memories 231 and 233 in the group G2' and the signal charge stored in each of the analog memories 231 and 233 in the group G4', and an averaging transistor that averages the signal charge stored in each of the analog memories 232 and 234 in the group G2' and the signal charge stored in each of the analog memories 232 and 234 in the group G4', are arranged.

Figure 13:
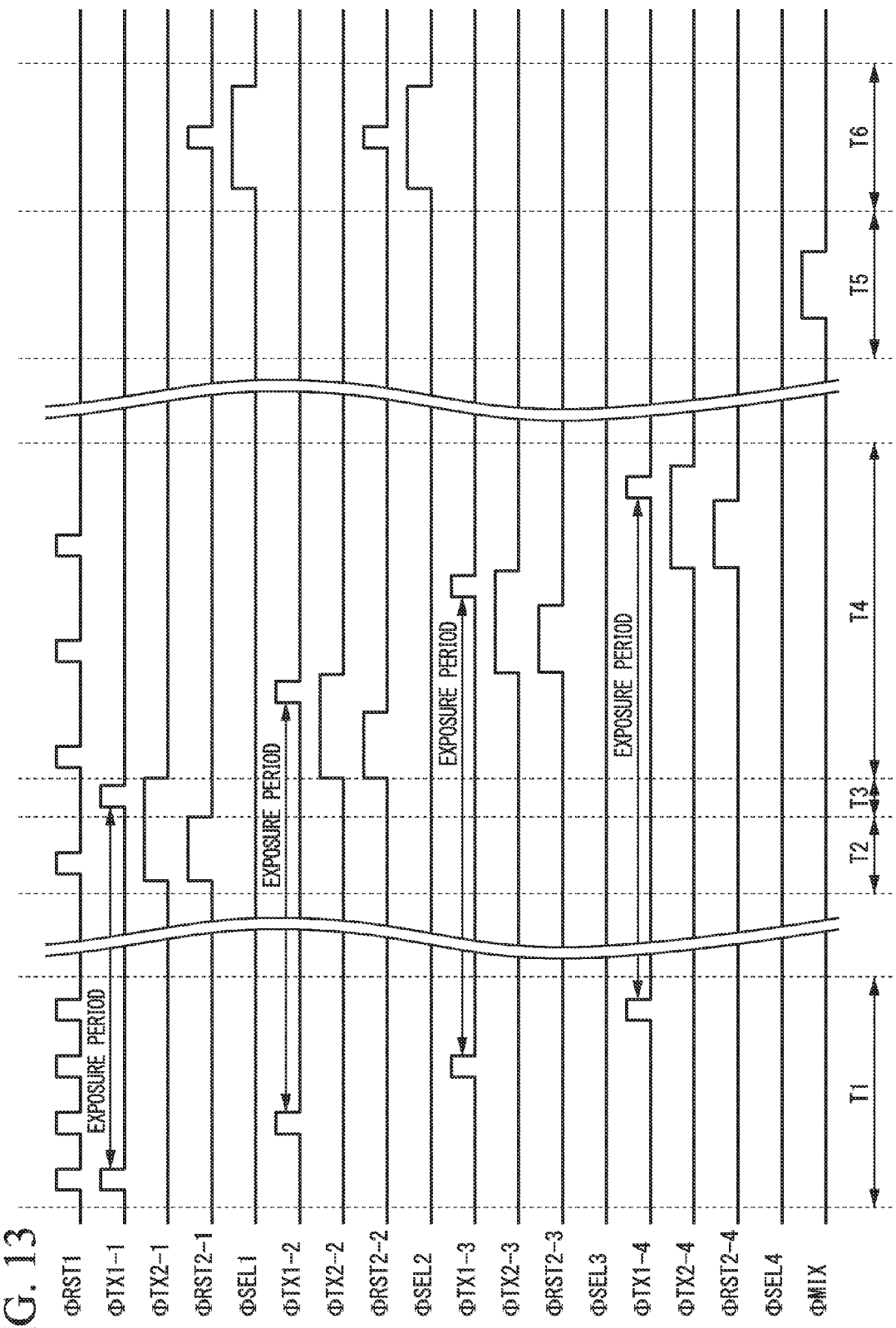
FIG. 13 is a timing chart illustrating operation of pixels included in the solid-state image pickup device according to the second embodiment of the present invention.

Hereinafter, operations of the pixels 100A and 100B are explained with reference to FIG. 13. FIG. 13 illustrates control signals supplied from the vertical scanning circuits 300A and 300B to the pixels 100A and 100B in units of rows. Here, the four pixels 100A in the same group, which respectively include the first transfer transistors 211, 212, 213, and 214 supplied with the transfer pulses ΦTX1-1, ΦTX1-2, ΦTX1-3, and ΦTX1-4, are arranged in the same row and different columns. For this reason, the four transfer pulses ΦTX1-1, ΦTX1-2, ΦTX1-3, and ΦTX1-4 are supplied from the vertical scanning circuit 300A with respect to the same row. Hereinafter, operations are explained with respect to the group of the four pixels 100A and the group of the four pixels 100B, which are shown in FIGS. 11A and 11B. Here, operations from the period T1 to period T4 are the same as those of the first embodiment. Therefore, only operation in the period T5 and operation in the period T6 are explained.

[Operation in Period T5]

Firstly, the averaging pulse ΦMIX changes from "L" level to "H" level, thereby turning on the averaging transistors 275 and 276. Thus, the voltage of the one terminal of each of the analog memories 231 and 233 becomes identical, and the voltage of the one terminal of each of the analog memories 232 and 234 becomes identical. Thus, the signal charge stored in each of the analog memories is averaged. This operation ends by the averaging pulse ΦMIX changing from "H" level to the "L" level.

[Operation in Period T6]

In the period T6, signals based on the signal charge stored in the analog memories 231 and 232 in the two pixels 100B arranged in the same row are simultaneously read. Firstly, the select pulses ΦSEL1 and ΦSEL2 change from "L" level to "H" level, thereby turning on the select transistors 291 and 292. Thus, signals based on the voltage Vmem shown in equation (1) are output to the vertical signal lines 120 via the select transistors 291 and 292.

Then, the reset pulses ΦRST2-1 and ΦRST2-2 change from "L" level to "H" level, thereby turning on the second reset transistors 221 and 222. Thus, the analog memories 231 and 232 are reset, a signal based on the voltage of the one terminal of each of the analog memories 231 and 232 at the time of the resetting is output to the vertical signal line 120 via the corresponding one of the select transistors 291 and 292.

Subsequently, the reset pulses ΦRST2-1 and ΦRST2-2 change from "H" level to "L" level, thereby turning on the second reset transistors 221 and 222. Then, the select pulses ΦSEL1 and ΦSEL2 change from "H" level to "L" level, thereby turning off the select transistors 291 and 292.

The column processing circuit 350 generates a difference signal by calculating the difference between the signal based on the voltage Vmem shown in equation (1) and the signal based on the voltage of the one terminal of each of the analog memories 231 and 232 at the time of resetting the analog memories 231 and 232. The difference signal is a signal based on the difference between the voltage Vmem shown in equation (1) and the power voltage VDD, that is, a signal based on the difference $\Delta V_{fd}$ between the voltage of the one terminal of the voltage retention unit 230 immediately after the signal charge stored in the photoelectric conversion elements 201 and 202 is transferred to the charge retention unit 230, and the voltage of the charge retention unit 230 immediately after the one terminal of the charge retention unit 230 is reset. Accordingly, signal elements based on the signal charge stored in the photoelectric conversion elements 201 and 202 can be obtained while suppressing noise elements caused by resetting the analog memories 231 and 232 and noise elements caused by resetting the electric retention unit 230.

The horizontal scanning circuit 400 inputs the signals output from the column processing circuits 350, to the output amplifiers 410 via the output channels 430. The output amplifier 410 processes the input signals and output the processed signals as image signals. Thus, reading of signals from the two pixels 100B arranged in the same row, which are two pixels of the four pixels 100B included in one group, ends.

By the above operations, the pixel signal corresponding to B is output from the pixel 100B in the first row, which is one of the pixels 100B corresponding to B which are arranged in the first column shown in FIG. 11B. Additionally, the pixel signal corresponding to Gb is output from the pixel 100B in the first row, which is one of the pixels 100B corresponding to Gb which are arranged in the second column shown in FIG. 11B. Further, the pixel signal corresponding to R is output from the pixel 100B in the first row, which is one of the pixels 100B corresponding to R which are arranged in the third column shown in FIG. 11B. Moreover, the pixel signal corresponding to Gr is output from the pixel 100B in the first row, which is one of the pixels 100B corresponding to Gr which are arranged in the first column shown in FIG. 11B. Each of the pixel signals is the pixel signal obtained by performing the averaging process on the four pixels 100B adjacently arranged in the column direction. Accordingly, the averaged pixel signals are output from part of the pixels 100B obtained by subsampling the pixels 100B in the column direction.

In the above operations, the averaging process is performed on the four pixels 100B adjacently arranged in the column direction. Then, signals are read from the pixels 100B at rate of one row every four rows. For this reason, the averaging process is performed on the pixels 100B in two groups adjacently arranged in the column direction on the second substrate 21. Then, signals are read from only the two pixels 100B included in one of the two groups. For example, in the case of FIG. 11B, the groups G1' and the group G3' are arranged adjacently in the column direction. The averaging process is performed on the pixels 100B in those two groups. Then, signals are read from the pixels 100B-1 and 100B-2 in the group G1', but not from the other pixels 100B in the groups G1' and G3'.

Accordingly, the operations in the periods T5 and T6 shown in FIG. 13 are performed by the pixels 100B in the group G1'. However, the operation in the period T5 shown in FIG. 13 is performed by the pixels 100B in group G3', but the operation in the period T6 is not performed thereby. The similar applies to the groups G2' and G4'. The operations in the periods T5 and T6 shown in FIG. 13 are performed by the pixels 100B in the group G2'. However, the operation in the period T5 is performed by the pixels 100B in the group G4', and the operation in the period T6 is not performed thereby.

Figure 14:
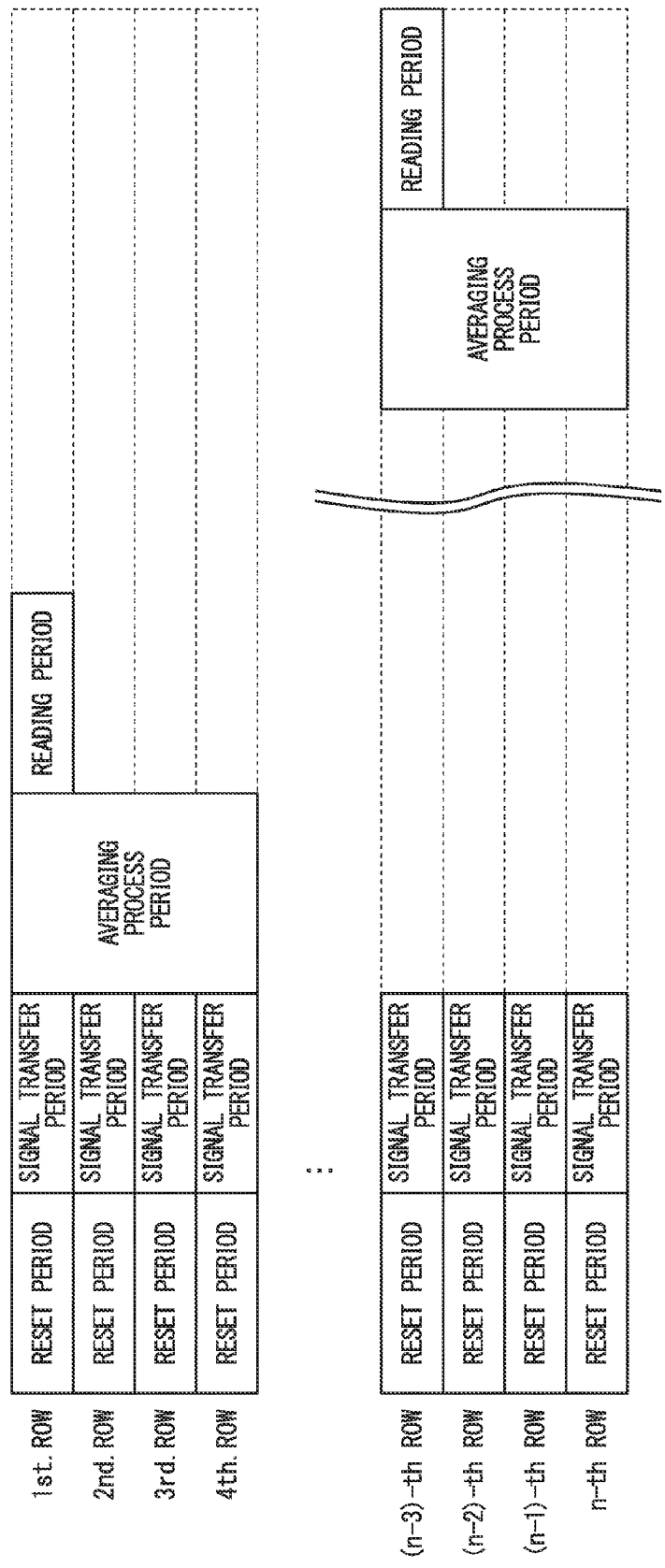
FIG. 14 is a timing chart illustrating operation of pixels included in the solid-state image pickup device according to the second embodiment of the present invention.
Figure 15:
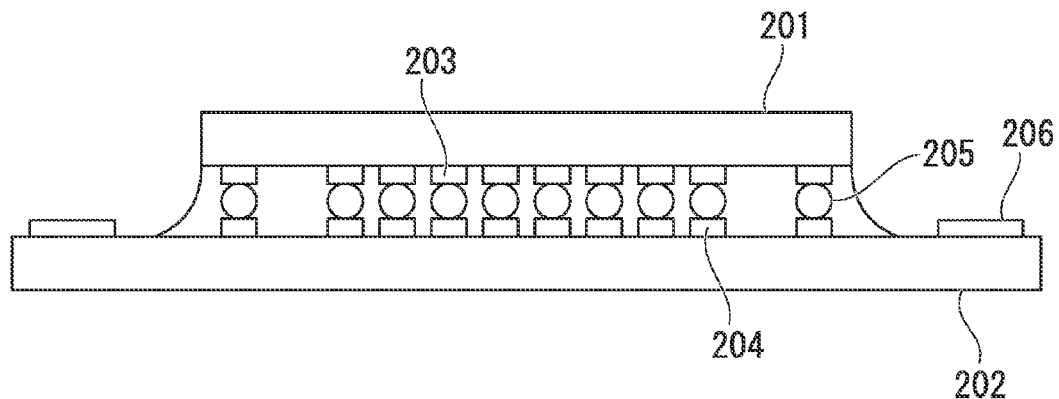
FIG. 15 is a cross-sectional view illustrating a configuration of a solid-state image pickup device of related art.
Figure 16:
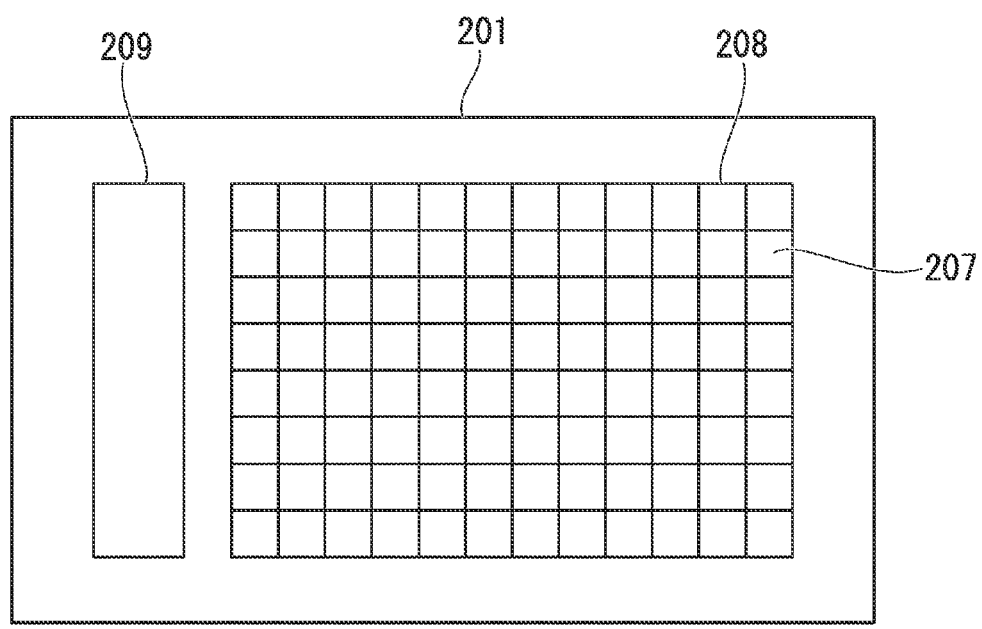
FIG. 16 is a configuration diagram illustrating a configuration of a first substrate included in the solid-state image pickup device of the related art.
Figure 17:
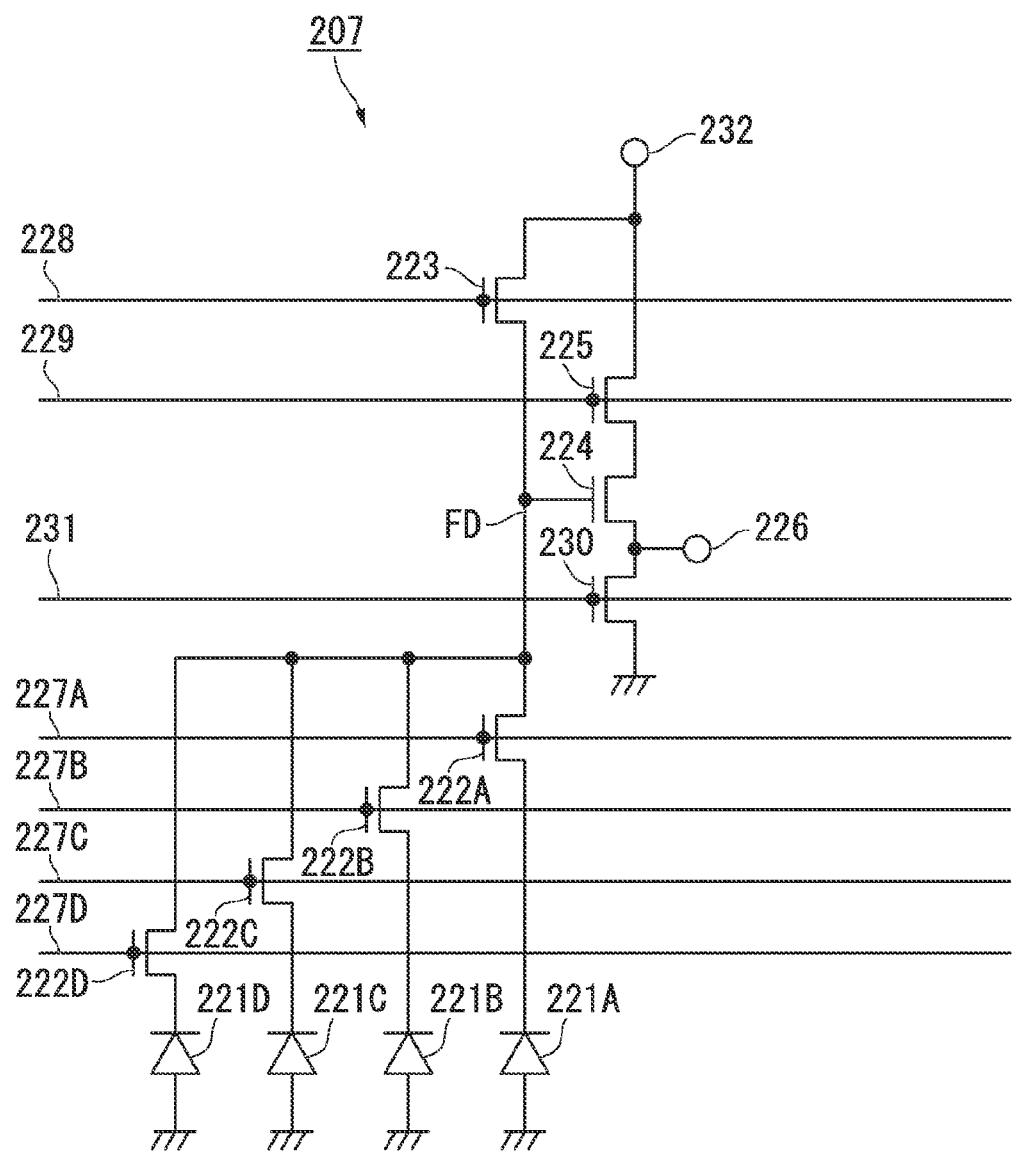
FIG. 17 is a circuit diagram illustrating a circuit configuration of a pixel cell on the first substrate included in the solid-state image pickup device of the related art.
Figure 18:
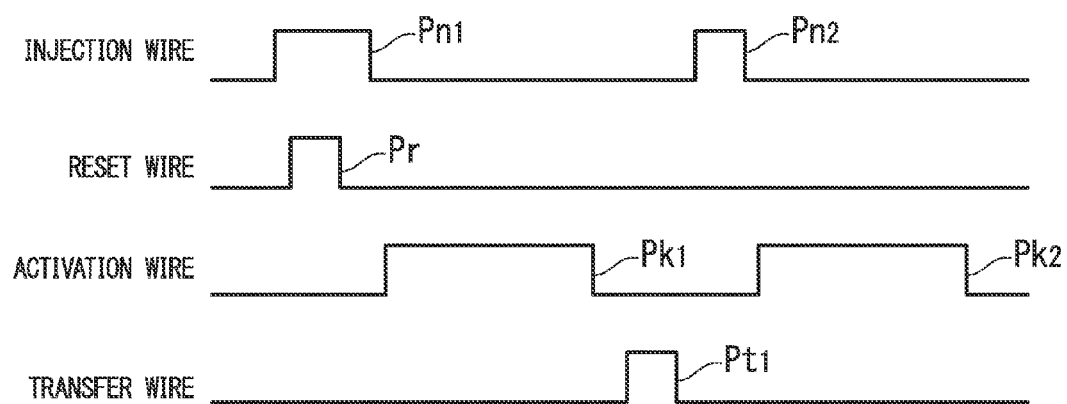
FIG. 18 is a timing chart illustrating operation of pixels included in the solid-state image pickup device according to the related art.

In the second embodiment, similar to the first embodiment, the groups of the pixels 100A have the same operational timing regardless of the positions thereof in the vertical direction (hereinafter referred to as the vertical position). Additionally, the groups of the pixels 100B at different vertical positions have different operational timings in accordance with the respective operational periods. FIG. 14 schematically illustrates the operational timing per group in a case where the pixels 100A and 100B are arranged in n rows. In FIG. 14, positions in the vertical direction denote the vertical positions in the arrangement of the pixels 100A and 100B, that are, row positions. Additionally, positions in the horizontal direction denote the time positions. FIG. 14 corresponds to a case where the pixels 100A and 100B are arranged in n rows×n columns, which is more general arrangement.

The reset period corresponds to the period T1 shown in FIG. 13. The signal transfer period corresponds to the periods T2, T3, and T4 shown in FIG. 13. The averaging process period corresponds to the period T5 shown in FIG. 13. The reading period corresponds to the period T6 shown in FIG. 13. The groups of the pixels 100A have the same reset period and the same signal transfer period, regardless of the vertical positions thereof. On the other hand, the groups of the pixels 100B at the different vertical positions have the same signal transfer period, but have different averaging process periods and different reading periods. In the aforementioned operation, the exposure timing differs for each pixel included in the same group, but synchronization of the exposure can be achieved for the entire group.

In the above case, the averaging process is performed on the four pixels adjacently arranged in the column direction. However, the number of pixels 100B subjected to the averaging process is not limited to four. For example, the averaging process may be performed on two pixels 100B adjacently arranged in the column direction or on eight pixels 100B adjacently arranged in the column direction.

As explained above, according to the second embodiment, each signal (signal charge) stored in the signal storing circuit (analog memory) included in each of the multiple pixels 100B is averaged, thereby preventing moire fringes from being included in an image formed by each signal output from the pixel. Additionally, the averaging process enables a reduction in random noise elements included in the signal. Accordingly, it is possible to reduce the deterioration of image quality.

In the second embodiment, the four pixels 100B corresponding to the same color are adjacently arranged in the vertical direction (column direction), and signal charge stored in the analog memories in those four pixels 100B is averaged. Thus, the signal charge stored in the pixels 100B adjacently arranged in the vertical direction is averaged, thereby simplifying the layout of the averaging transistors 275 and 276. Even in a case where crosstalk occurs between the two pixels 100B corresponding to the same color which are adjacently arranged in the vertical direction, it is possible to reduce deterioration in the image quality caused by the crosstalk, compared to a case where crosstalk occurs between two pixels 100B corresponding to different colors.

In the second embodiment, the averaged signal is output from only one pixel 100B among the four pixels 100B arranged in the vertical direction. Thereby, the number of rows in the vertical direction from which signals are read becomes a quarter of the number of all rows in the arrangement of the pixels. For this reason, it is possible to read signals at high speed compared to a case where signals are read from all the rows, thereby enabling a reduction in power consumption. Additionally, for multiple groups at the same vertical position on the second substrate 21, signals are read from the pixels 100B in the same row. Thereby, it is possible to perform control of reading the averaged signal in units of rows, thereby making it easier to perform control of reading signals.

Additionally, some circuit elements are shared by multiple pixels, thereby enabling a reduction in chip area compared to a case where no circuit element is shared by multiple pixels. Further, the first amplifier transistor 240 and the current source 280 are shared by the multiple pixels, thereby reducing the number of current sources which simultaneously operate. For this reason, it is possible to reduce voltage drop of the power voltage which is caused by multiple current sources operating simultaneously, an increase in GND voltage, and the like.

Moreover, it is possible to increase the area of the photoelectric conversion element on the first substrate 20, compared to a case where all circuit elements constituting pixels are arranged on one substrate, thereby enhancing the sensitivity. Further, by use of the analog memories, it is possible to reduce the area of the region for storing signal charge, on the second substrate 21.

Additionally, the analog memories 231, 232, 233, and 234 are provided, thereby reducing deterioration of the signal quality. Particularly, the capacitance value of the analog memory is set to be greater than the capacitance value of the charge retention unit (for example, the capacitance value of the analog memory is set to be five times or more the capacitance value of the charge retention unit). Thereby, the signal charge stored in the analog memory is larger than the signal charge stored in the charge retention unit. For this reason, it is possible to reduce the effect of the deterioration of the signal quality due to leak current of the analog memory.

Further, the clamp capacitor 260 and the second transfer transistors 271, 272, 273, and 274 are provided, thereby reducing the effect of the noises occurring in the first substrate 20. The noises generated in the first substrate 20 include: noise (such as reset noise) generated in the input unit of the first amplifier transistor 240, which results from operation of a circuit coupled to the first amplifier transistor 240 (such as the first reset transistor 220); noise (such as noise resulting from a variation in circuit threshold of the first amplifier transistor 240) resulting from the operational property of the first amplifier transistor 240; and the like.

Moreover, the signal at the time of resetting the analog memories 231, 232, 233, and 234, and the signal according to the change in the outputs of the first amplifier transistor 240 which is caused by the signal charge being transferred from the photoelectric conversion elements 201, 202, 203, and 204 to the charge retention unit 230, are output by time division from the pixel 100B. Then, the process of calculating the difference between those signals is performed outside the pixel 100B, thereby reducing noises generated in the second substrate 21. The noises generated in the second substrate 21 include noise (such as reset noise) generated in the input units of the second amplifier transistors 241, 242, 243, and 244, which results from operations of circuits coupled to the second amplifier transistors 241, 242, 243, and 244 (such as the second reset transistors 241, 242, 243, and 244), and the like.

A first pixel according to the present invention corresponds to, for example, the pixel 100A. A second pixel according to the present invention corresponds to, for example, the pixel 100B. Signal storing circuits according to the present invention correspond to, for example, the analog memories 231, 232, 233, and 234. Output circuits according to the present invention correspond to, for example, the select transistors 291, 292, 293, and 294. Controllers according to the present invention correspond to, for example, the vertical scanning circuits 300A and 300B.

Averaging circuits according to the present invention correspond to, for example, the averaging transistors 275 and 276.

Although the embodiments of the present invention have been explained above with reference to the drawings, specific configurations are not limited the above embodiments, and various design modifications may be made without departing from the scope of the present invention. Although the configuration of the solid-state image pickup device including two substrates coupled by couplers has been shown in the above embodiments, three or more substrates may be coupled by couplers. In a case of a solid-state image pickup device including three or more substrates coupled by couplers, two of the three or more substrates correspond to the first substrate and the second substrate.

A program for realizing arbitrary combinations of each constituent element and each operational process explained above is also effective as an embodiment of the present invention. Such a program may be recorded in a computer-readable recording medium, and a computer may read and execute the program recorded in that recording medium to achieve the object of the present invention.

Here, the "computer" also includes a homepage-providing environment (or a display environment) if a WWW system is used. Additionally, the "computer-readable recording medium" refers to a portable medium such as a flexible disk, a magnetic optical disc, a ROM, and a CD-ROM, or a storage device such as a hard disk embedded in the computer system. Further, the "computer-readable recording medium" also includes a recording medium that stores a program for a certain period of time, such as a volatile memory (RAM) in a computer system including a server and a client in a case where the program is transmitted via a network such as the Internet or a communication line such as a telephone line.

Additionally, the aforementioned program may be transferred from the computer storing that program in the storage device or the like, to another computer via a transmission medium or transmission waves in the transmission medium. Here, the "transmission medium" transferring the program means a medium having a function of transferring information, which includes a network such as the Internet or a telecommunication line (communication line) such as a telephone line. Further, the program may be a program for realizing part of the aforementioned functions or may be a program capable of realizing the aforementioned functions in combination with a program already recorded in the computer system, that is, a difference file (difference program).

Further, a computer product for realizing arbitrary combinations of each constituent element and each operational process explained above is also effective as an embodiment of the present invention. Here, the "computer product" includes: a recording medium storing a program code (such as DVD mediums, hard disk mediums, and memory mediums); a device storing a program code (such as computer); a system storing a program code (such as a system including a server and a client terminal); and the like. In this case, each constituent element or each operational process is implemented by a module, and a program code including such modules is stored in the computer product.

Although the embodiments of the present invention have been explained above, various substituted, modified, and equivalent elements or processes may be used as the aforementioned constituent elements and operational processes. In the above embodiments disclosed in the present specification, one component may be replaced with multiple components, or multiple components may be replaced with one component, in order to execute one or more functions. Such replacement is within the scope of the present invention unless such replacement does not adequately work to achieve the object of the present invention. Accordingly, the present invention is not determined with reference to the above explanations, but should be determined by the claims. Additionally, the entire scope of equivalents is included in the present invention. In the claims, the number of each constituent element is one or more unless otherwise mentioned expressly. Unless the expression of "a means for . . . " is expressly used in the claims, the claims may not be interpreted as including a means-plus-function limitation.

Terms in the present specification are used only for explaining particular embodiments, not to limit the present invention. In the present specification, a term in singular form may not exclude interpretation of the same term in plural form unless such exclusion is expressly mentioned in a context.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to a device equipped with the present invention.

The term "configured" is used to describe a component, section or part of a device includes hardware and/or software that is constructed and/or programmed to carry out the desired function.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

In addition, while not specifically claimed in the claim section, the application reserves the right to include in the claim section at any appropriate time the following devices and computer program products.

A solid-state image pickup device according to one embodiment of the present invention may be a solid-state image pickup device comprising:

a first substrate comprising a plurality of first pixels arranged in a matrix, each of the first pixels comprising a photoelectric conversion means configured to generate a color signal corresponding to one of first to n-th colors where n is an integer equal to or greater than two; and a second substrate electrically coupled to the first substrate, the second substrate comprising a plurality of second pixels arranged in a matrix, each of the second pixels comprising:

a signal storing means configured to store the color signal generated by the photoelectric conversion means; and an output means configured to output from the second pixel to an external unit, the color signal stored in the signal storing means, wherein the first pixel comprising the photoelectric conversion means configured to generate the color signal corresponding to an m-th color is the first pixel corresponding to the m-th color where m is an integer equal to one of 1 to n, the second pixel comprising the signal storing means configured to store the color signal corresponding to the m-th color is the second pixel corresponding to the m-th color, and at least two second pixels of the second pixels corresponding to the same color are arranged in the same column on the second substrate.

A solid-state image pickup device according to another embodiment of the present invention may be a solid-state image pickup device comprising:

a first substrate comprising a plurality of first pixels arranged in a matrix, each of the first pixels comprising a photoelectric conversion means configured to generate a color signal corresponding to one of first to n-th colors where n is an integer equal to or greater than two; and a second substrate electrically coupled to the first substrate, the second substrate comprising a plurality of second pixels arranged in a matrix, each of the second pixels comprising:

a signal storing means configured to store the color signal generated by the photoelectric conversion means; and an output means configured to output from the second pixel to an external unit, the color signal stored in the signal storing means, wherein the first pixel comprising the photoelectric conversion means configured to generate the color signal corresponding to an m-th color is the first pixel corresponding to the m-th color where m is an integer equal to one of 1 to n, the second pixel comprising the signal storing means configured to store the color signal corresponding to the m-th color is the second pixel corresponding to the m-th color, and an arrangement of colors corresponding to the first pixels differs from an arrangement of colors corresponding to the second pixels.

A solid-state image pickup device according to another embodiment of the present invention may be a solid-state image pickup device comprising:

a first substrate comprising a plurality of first pixels arranged in a matrix, each of the first pixels comprising a photoelectric conversion means configured to generate a color signal corresponding to one of first to n-th colors where n is an integer equal to or greater than two; and a second substrate electrically coupled to the first substrate, the second substrate comprising: a plurality of second pixels arranged in a matrix; and a vertical signal line provided for each column, each of the second pixels comprising:
- a signal storing means coupled to the vertical signal line, the signal storing means being configured to store the color signal generated by the photoelectric conversion means; and
- an output means configured to output from the second pixel to an external unit, the color signal stored in the signal storing means, wherein the first pixel comprising the photoelectric conversion means configured to generate the color signal corresponding to an m-th color is the first pixel corresponding to the m-th color where m is an integer equal to one of 1 to n, and the color signal generated by the photoelectric conversion means included in one of the first pixels corresponding to the same color is stored in a corresponding one of the signal storing means coupled to the same vertical signal line.

An image pickup device according to another embodiment of the present invention may be an image pickup device comprising:
a first substrate comprising a plurality of first pixels arranged in a matrix, each of the first pixels comprising a photoelectric conversion means configured to generate a color signal corresponding to one of first to n-th colors where n is an integer equal to or greater than two; and
a second substrate electrically coupled to the first substrate, the second substrate comprising a plurality of second pixels arranged in a matrix, each of the second pixels comprising:
- a signal storing means configured to store the color signal generated by the photoelectric conversion means; and
- an output means configured to output from the second pixel to an external unit, the color signal stored in the signal storing means, wherein the first pixel comprising the photoelectric conversion means configured to generate the color signal corresponding to an m-th color is the first pixel corresponding to the m-th color where m is an integer equal to one of 1 to n, the second pixel comprising the signal storing means configured to store the color signal corresponding to the m-th color is the second pixel corresponding to the m-th color, and at least two second pixels of the second pixels corresponding to the same color are arranged in the same column on the second substrate.

An image pickup device according to another embodiment of the present invention may be an image pickup device comprising:
a first substrate comprising a plurality of first pixels arranged in a matrix, each of the first pixels comprising a photoelectric conversion means configured to generate a color signal corresponding to one of first to n-th colors where n is an integer equal to or greater than two; and
a second substrate electrically coupled to the first substrate, the second substrate comprising a plurality of second pixels arranged in a matrix, each of second pixels comprising:
- a signal storing means configured to store the color signal generated by the photoelectric conversion means; and
- an output means configured to output from the second pixel to an external unit, the color signal stored in the signal storing means, wherein the first pixel comprising the photoelectric conversion means configured to generate the color signal corresponding to an m-th color is the first pixel corresponding to the m-th color where m is an integer equal to one of 1 to n, the second pixel comprising the signal storing means configured to store the color signal corresponding to the m-th color is the second pixel corresponding to the m-th color, and an arrangement of colors corresponding to the first pixels differs from an arrangement of colors corresponding to the second pixels.

An image pickup device according to another embodiment of the present invention may be an image pickup device comprising:
a first substrate comprising a plurality of first pixels arranged in a matrix, each of the first pixels comprising a photoelectric conversion means configured to generate a color signal corresponding to one of first to n-th colors where n is an integer equal to or greater than two; and
a second substrate electrically coupled to the first substrate, the second substrate comprising: a plurality of second pixels arranged in a matrix; and a vertical signal line provided for each column, each of the second pixels comprising:
- a signal storing means coupled to the vertical signal line, the signal storing means being configured to store the color signal generated by the photoelectric conversion means; and
- an output means configured to output from the second pixel to an external unit, the color signal stored in the signal storing means, wherein the first pixel comprising the photoelectric conversion means configured to generate the color signal corresponding to an m-th color is the first pixel corresponding to the m-th color where m is an integer equal to one of 1 to n, and the color signal generated by the photoelectric conversion means included in one of the first pixels corresponding to the same color is stored in a corresponding one of the signal storing means coupled to the same vertical signal line.

A computer program product according to another embodiment of the present invention may be a computer program product storing a program code that causes a computer to execute:
generating a color signal corresponding to one of first to n-th colors in one of a plurality of first pixels included in a first substrate, where n is an integer equal to or greater than two;
storing the color signal generated in a corresponding one of a plurality of second pixels arranged in the same column on a second substrate electrically coupled to the first substrate; and
outputting the color stored from the second pixel to an external unit.

What is claimed is:

1. A solid-state image pickup device comprising:
a first substrate comprising a plurality of first pixels arranged in a matrix, each of the first pixels comprising a photoelectric conversion element configured to generate a color signal corresponding to one of first to n-th colors where n is an integer equal to or greater than two; and
a second substrate electrically coupled to the first substrate, the second substrate comprising a plurality of second pixels arranged in a matrix, and each of the second pixels comprising:
- a signal storing circuit configured to store the color signal generated by the photoelectric conversion element; and
- an output circuit configured to output from the second pixel to an external unit, the color signal stored in the signal storing circuit, wherein:

the first pixel corresponding to a m-th color comprises the photoelectric conversion element configured to generate the color signal corresponding to the m-th color where m is an integer equal to one of 1 to n, the second pixel corresponding to the m-th color comprises the signal storing circuit configured to store the color signal corresponding to the m-th color, at least two of the first pixels corresponding to the m-th color are arranged in the same row on the first substrate, at least two of the second pixels corresponding to the at least two of the first pixels are arranged in the same column on the second substrate, at least two first pixels of the first pixels corresponding to a predetermined color of the first to n-th colors are arranged in different columns on the first substrate, at least two second pixels of the second pixels corresponding to the predetermined color are arranged in the same column on the second substrate, the first pixels are arranged according to a Bayer arrangement of R, B, Gr, and Gb, the predetermined color comprises Gr and Gb, the first pixel corresponding to Gr and the first pixel corresponding to Gb are arranged in different columns on the first substrate, and the second pixel corresponding to Gr and the second pixel corresponding to Gb are arranged in the same column on the second substrate.

2. The solid-state image pickup device according to claim 1, wherein the color signal generated by the photoelectric conversion element included in one of the first pixels corresponding to the predetermined color is stored in the signal storing circuit included in a corresponding one of the second pixels arranged in the same column.

3. The solid-state image pickup device according to claim 1, further comprising:

a controller configured to perform control of transferring the color signal generated by the photoelectric conversion element included in one of the first pixels corresponding to the predetermined color, to the signal storing circuit included in a corresponding one of the second pixels arranged in the same column.

4. The solid-state image pickup device according to claim 1, further comprising:

a vertical signal line provided for each column of the second pixels, the color signal stored in the signal storing circuit being output to the vertical signal line; and an output channel configured to output from the solid-state image pickup device to an external unit, the color signal output to the vertical signal line.

5. The solid-state image pickup device according to claim 4, further comprising:

a plurality of output channels configured to output from the solid-state image pickup device to external units, the color signals output to the vertical signal lines, wherein the color signal stored in the signal storing circuit in the second pixel is output to the vertical signal line provided for the column in which the second pixel is disposed, the color signal corresponding to the predetermined color, which is one of the color signals output to the vertical signal lines, is output to one of the output channels, and the color signal corresponding to a color other than the predetermined color, which is one of the color signals output to the vertical signal lines, is output to another one of the output channels.

6. The solid-state image pickup device according to claim 5, wherein the color signal corresponding to the predetermined color comprises a G signal.

7. The solid-state image pickup device according to claim 6, wherein the color signal corresponding to the color other than the predetermined color comprises any one of an R signal and a B signal.

8. The solid-state image pickup device according to claim 1, wherein the first pixels corresponding to each of at least two colors of the first to n-th colors belong to a first group on the first substrate, the at least two colors including the predetermined color, the second pixels corresponding to each of the at least two colors belong to a second group on the second substrate, at least two first pixels of the first pixels corresponding to the predetermined color and belonging to the first group are arranged in different columns on the first substrate, and at least two second pixels of the second pixels corresponding to the predetermined color and belonging to the second group are arranged in the same column on the second substrate.

9. A solid-state image pickup device comprising:

a first substrate comprising a plurality of first pixels arranged in a matrix, each of the first pixels comprising a photoelectric conversion element configured to generate a color signal corresponding to one of first to n-th colors where n is an integer equal to or greater than two; and a second substrate electrically coupled to the first substrate, the second substrate comprising a plurality of second pixels arranged in a matrix, and each of the second pixels comprising:

a signal storing circuit configured to store the color signal generated by the photoelectric conversion element; and an output circuit configured to output from the second pixel to an external unit, the color signal stored in the signal storing circuit, wherein:

the first pixel corresponding to a m-th color comprises the photoelectric conversion element configured to generate the color signal corresponding to the m-th color where m is an integer equal to one of 1 to n, the second pixel corresponding to the m-th color comprises the signal storing circuit configured to store the color signal corresponding to the m-th color, at least two of the first pixels corresponding to the m-th color are arranged in the same row on the first substrate, at least two of the second pixels corresponding to the at least two of the first pixels are arranged in the same column on the second substrate, at least two first pixels of the first pixels corresponding to a predetermined color of the first to n-th colors are arranged in different columns on the first substrate, at least two second pixels of the second pixels corresponding to the predetermined color are arranged in the same column on the second substrate, the first pixels are arranged according to a Bayer arrangement of R, B, Gr, and Gb, the predetermined color comprises Gr and Gb, two first pixels of the first pixels corresponding to B and two first pixels of the first pixels corresponding to Gr belong to a first group on the first substrate, two first pixels of the first pixels corresponding to R and two first pixels of the first pixels corresponding to Gb belong to a second group on the first substrate, two second pixels of the second pixels corresponding to B and two second pixels of the second pixels corresponding to R belong to a third group on the second substrate, two second pixels of the second pixels corresponding to Gr and two second pixels of the second pixels corresponding to Gb belong to a fourth group on the second substrate, the two first pixels corresponding to Gr and belonging to the first group and the two second pixels corresponding to Gb and belonging to the second group are arranged in different columns on the first substrate, and the two second pixels corresponding to Gr and belonging to the fourth group and the two second pixels corresponding to Gb and belonging to the fourth group are arranged in the same column on the second substrate.

10. The solid-state image pickup device according to claim 9, wherein the two second pixels corresponding to B and belonging to the third group and the two second pixels corresponding to R and belonging to the third group are arrange in the same column on the second substrate.

11. A solid-state image pickup device comprising:

a first substrate comprising a plurality of first pixels arranged in a matrix, each of the first pixels comprising a photoelectric conversion element configured to generate a color signal corresponding to one of first to n-th colors where n is an integer equal to or greater than two;

a second substrate electrically coupled to the first substrate, the second substrate comprising a plurality of second pixels arranged in a matrix, and each of the second pixels comprising a signal storing circuit configured to store the color signal generated by the photoelectric conversion element;

an averaging circuit configured to average each of the color signals stored in the signal storing circuits included in at least two second pixels of the second pixels arranged in the same column; and an output circuit configured to output each of the color signals averaged from the second pixel to an external unit, wherein:

the first pixel corresponding to a m-th color comprises the photoelectric conversion element configured to generate the color signal corresponding to the m-th color where m is an integer equal to one of 1 to n, the second pixel corresponding to the m-th color comprises the signal storing circuit configured to store the color signal corresponding to the m-th color, at least two of the first pixels corresponding to the m-th color are arranged in the same row on the first substrate, at least two of the second pixels corresponding to the at least two of the first pixels are arranged in the same column on the second substrate, the averaging circuit is configured to average each of the color signals stored in the signal storing circuits of at least two second pixels of the second pixels corresponding to the same color, the at least two second pixels being arranged in the same column, the first pixels are grouped into a plurality of first groups, one of the first groups includes at least two first pixels of the first pixels, the second pixels are grouped into a plurality of second groups respectively corresponding to the plurality of first groups, one of the second groups includes at least two second pixels of the second pixels, at least two first pixels of the first pixels belonging to the one of the first groups and corresponding to a predetermined color of the first to n-th colors are arranged in different columns, at least two second pixels of the second pixels belonging to the second groups and corresponding to the predetermined color are arranged in the same column, the averaging circuit is configured to average each of the color signals stored in the signal storing circuits included in the at least two second pixels corresponding to the predetermined color and arranged in the same column, the averaging circuit is configured to average each of the color signals stored in the signal storing circuits at different timings for each of the second groups.

12. The solid-state image pickup device according to claim 11, wherein the at least two second pixels corresponding to the predetermined color are adjacently arranged in the same column.

13. The solid-state image pickup device according to claim 11, wherein the output circuit is configured to output the color signal averaged, from a part of the second pixels obtained by subsampling the second pixels in a column direction.

* * * * *